US011114952B1

(12) United States Patent
Wallin et al.

(10) Patent No.: US 11,114,952 B1
(45) Date of Patent: Sep. 7, 2021

(54) PHASE-CHANGE COMPOSITES FOR ELECTROACTIVE DEVICES

(71) Applicant: Facebook Technologies, LLC, Menlo Park, CA (US)

(72) Inventors: Thomas Wallin, Redmond, WA (US); Austin Lane, Bellevue, WA (US); Christopher Yuan Ting Liao, Seattle, WA (US); Jack Lindsay, Seattle, WA (US); Tanya Malhotra, Redmond, WA (US); Andrew John Ouderkirk, Redmond, WA (US); Katherine Marie Smyth, Seattle, WA (US); Yigit Mengue, Kirkland, WA (US)

(73) Assignee: Facebook Technologies, LLC, Menlo Park, CA (US)

( * ) Notice: Subject to any disclaimer, the term of this patent is extended or adjusted under 35 U.S.C. 154(b) by 463 days.

(21) Appl. No.: 16/197,397

(22) Filed: Nov. 21, 2018

(51) Int. Cl.
*G02B 3/14* (2006.01)
*H01L 41/18* (2006.01)
*H02N 1/00* (2006.01)

(52) U.S. Cl.
CPC .............. *H02N 1/006* (2013.01); *G02B 3/14* (2013.01); *H01L 41/183* (2013.01)

(58) Field of Classification Search
CPC combination set(s) only.
See application file for complete search history.

(56) References Cited

U.S. PATENT DOCUMENTS

| | | | |
|---|---|---|---|
| 2005/0268744 A1* | 12/2005 | Embach | B62D 1/06 74/551.9 |
| 2013/0114148 A1* | 5/2013 | Aschwanden | G02B 26/004 359/666 |
| 2016/0170097 A1* | 6/2016 | Milton | B29D 11/00038 349/13 |
| 2018/0126381 A1* | 5/2018 | Huff | B01L 3/502761 |
| 2018/0316995 A1* | 11/2018 | Miyoshi | G10K 9/122 |

OTHER PUBLICATIONS

Danilo De Rossi,"Electro-Active Polymers for actuation and sensing in space applications," Proc. of the International Astronautical Cogress,2004, 55th International Astronautical Congress 2004—Vancouver, Canada, pp. 1-9.*

(Continued)

*Primary Examiner* — Omar S Ismail
(74) *Attorney, Agent, or Firm* — FisherBroyles, LLP

(57) ABSTRACT

A device, such as an electroactive device, may include primary electrode and a secondary electrode overlapping at least a portion of the primary electrode. An electroactive polymer element may include a composite polymer material and is disposed between and abuts each of the primary electrode and the secondary electrode. A phase change or other deformable medium such as a liquid, a gas, or a liquid-gas mixture may be disposed as inclusions within the polymer material. The device can be actuated by the application of a voltage between the electrodes and the attendant formation of a Maxwell stress, exposing the deformable medium to a source of radiation, changing a pressure of the deformable medium, or changing a temperature of the deformable medium, e.g., about a phase transformation temperature of the phase change medium.

20 Claims, 10 Drawing Sheets

(56) References Cited

OTHER PUBLICATIONS

Allahyarov, "Dipole correlation effects on the local field and the effective dielectric constant in composite dielectrics containing high-k inclusions," Jun. 15, 2016, Royal Society of Chemistry, Phys. Chem. Chem. Phys., 2016, 18, pp. 19104-19112.*

Hongwen Ren, "Adaptive Lenses Based on Soft Electroactive Materials," Apr. 7, 2018, Applied Sciences, Appl. Sci. 2018, 8, 1085, www.mdpi.com/journal/applsci, pp. 1-12.*

Kartikeya Mishra, "Recent Developments in Optofluidic Lens Technology", Oct. 6, 2016, Micromachines 2016, 7, 102; doi: 10.3390/mi7060102,www.mdpi.com/journal/micromachines, pp. 1-10 and 20.*

Jin Woo Bae1, "High-Performance PVC Gel for Adaptive Micro-Lenses with Variable Focal Length," May 18, 2017, www.nature.com/scientificreports,Scientific Reports | 7: 2068 | DOI:10.1038/s41598-017-02324-9,pp. 1-5.*

Christopher Ellingford, "Intrinsically Tuning the Electromechanical Properties of Elastomeric Dielectrics: A Chemistry Perspective",Feb. 8, 2018, Macromolecular Rapid Communication,https://doi.org/10.1002/marc.201800340,pp. 1-8,22-24.*

Miriyev et al., "Soft material for soft actuators", Nature Communications, Department of Mechanical Engineering, vol. 8, No. 596, 2017, pp. 1-8.

Pilet et al., "Piezoelectricity enhancement of P(VDF/TrFE) by X-ray irradiation", Organic Electronics, vol. 37, 2016, pp. 257-262.

Liu et al., "Control of crystal morphology and its effect on electromechanical performances of electrostrictive P(VDF-TrFE-CTFE) terpolymer", European Polymer Journal, vol. 91, 2017, pp. 46-60.

Le et al., "All-organic electrostrictive polymer composites with low driving electrical voltages for micro-fluidic pump applications", Scientific Reports, 5:11814, 2015, pp. 1-13.

Xia et al., "PVDF-based dielectric polymers and their applications in electronic materials", IET Nanodielectrics, vol. 1, No. 1, 2018, pp. 17-31.

Wang et al., "Tactile-Sensing Based on Flexible PVDF Nanofibers via Electrospinning: A Review", Sensors, vol. 18, 330, 2018, pp. 1-16.

Stevens et al., "A Review of Adjustable lenses for Head Mounted Displays", International Society for Optics and Photonics, Proceedings of SPIE, vol. 10335, Digital Optical Technologies, Sep. 12, 2017, 20 pages.

Li et al., "Studies on the transformation process of PVDF from α β phase by stretching", RSC Advances, vol. 4, 2014, pp. 3938-3943.

Mohammadi et al., "Effect of tensile strain rate and elongation on crystalline structure and piezoelectric properties of PVDF thin films", Polymer Testing, vol. 26, 2007, pp. 42-50.

Lazarus et al., "Geometry-Induced Rigidity in Nonspherical Pressurized Elastic Shells", Physical Review Letters, vol. 109, No. 14, 2012, 6 pages.

Bonora et al., Active diffraction gratings: Development and tests, Review of Scientific Instruments, vol. 83, No. 12, Dec. 19, 2012, pp. 1-9.

"Manufacture of dichroics, areas of application and specifications", Technology, specifications and application of dichroic filters, URL: https://www.prinzoptics.de/en/technology-specifications-and-application-dichroic-filters, as accessed on 2018, pp. 1-24.

Kleinhans, W. A., "Aberrations of curved zone plates and Fresnel lenses", Applied Optics, vol. 16, No. 6, Jun. 1977, pp. 1701-1704.

Haertling, G. H., "Improved Hot-Pressed Electrooptic Ceramics in the (Pb,La)(Zr,Ti)O3 System", Journal of the American Ceramic Society, vol. 54, No. 6, Jun. 1971, pp. 1-19.

Jiang et al., "Transparent Electro-Optic Ceramics and Devices", Optoelectronic Devices and Integration, International Society for Optics and Photonics, Proceedings of SPIE, vol. 5644, 2004, 16 pages.

Kong et al., "Transparent Ceramic Materials", Transparent Ceramics, Topics in Mining, Metallurgy and Materials Engineering, 2015, pp. 29-91.

* cited by examiner

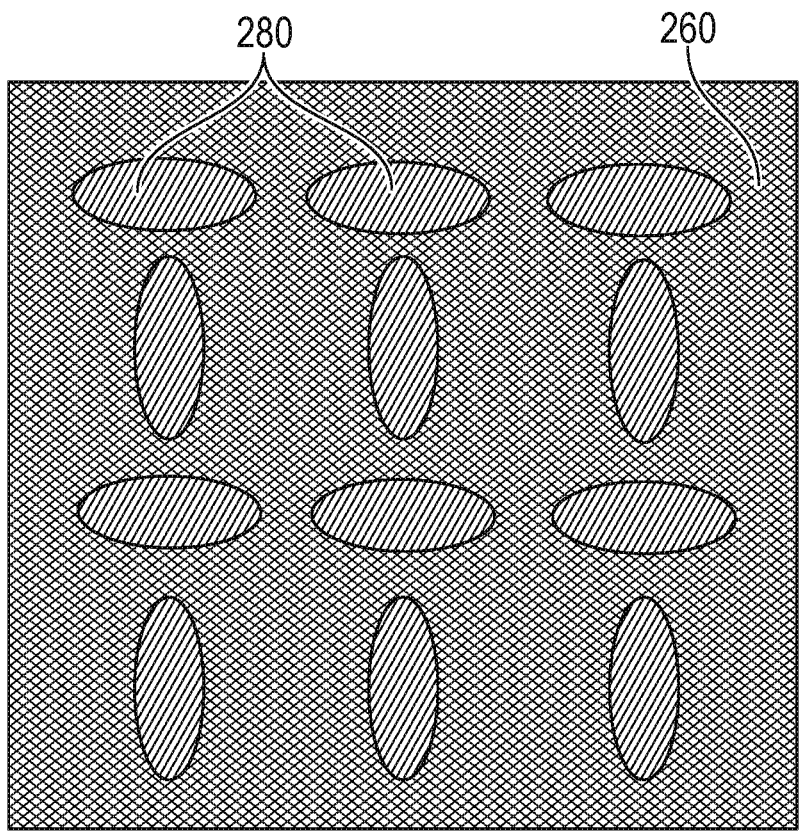
FIG. 2
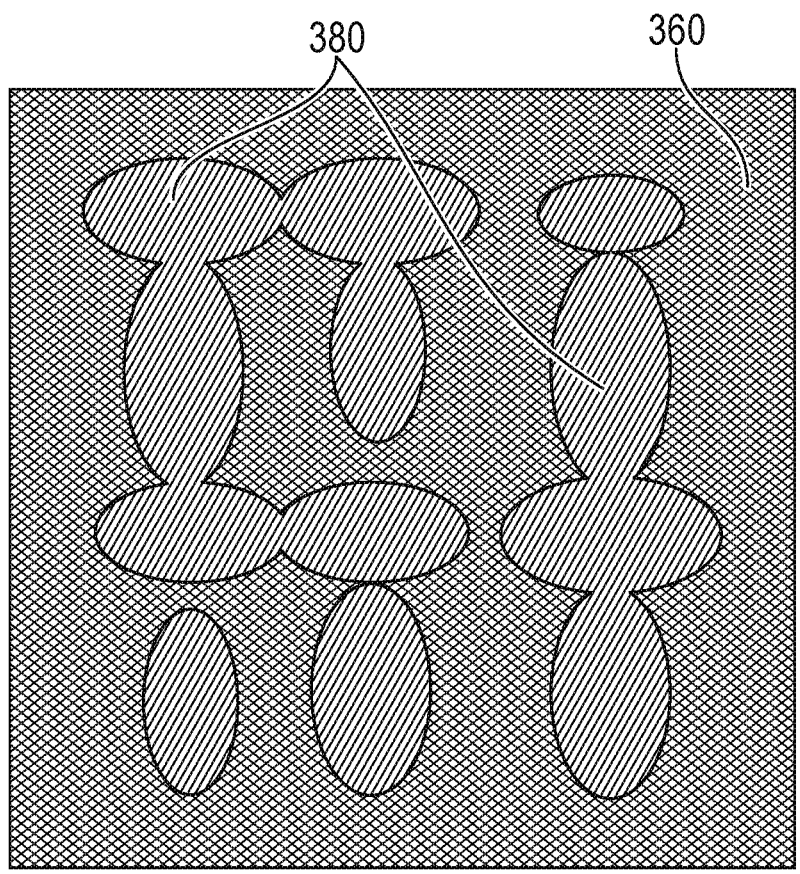
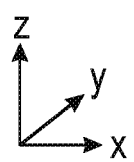
FIG. 3

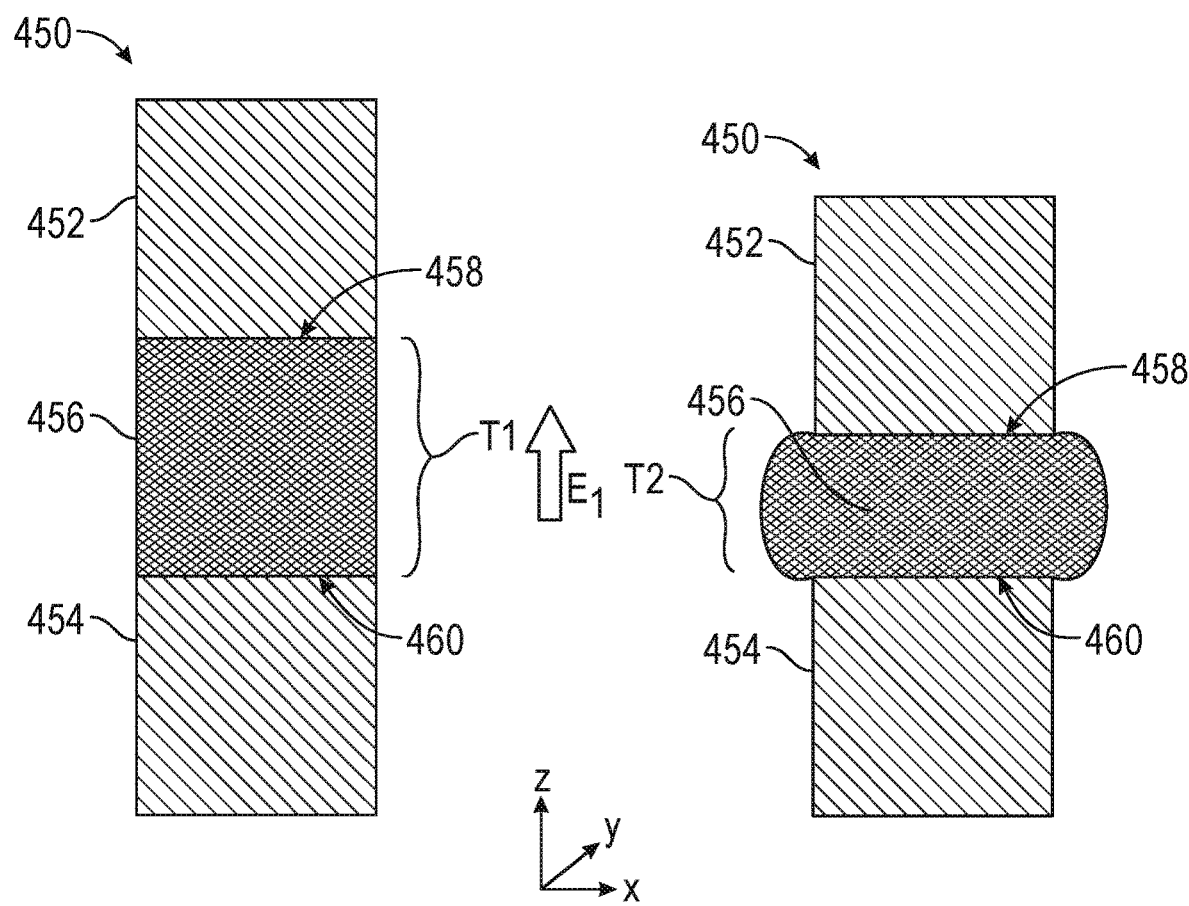

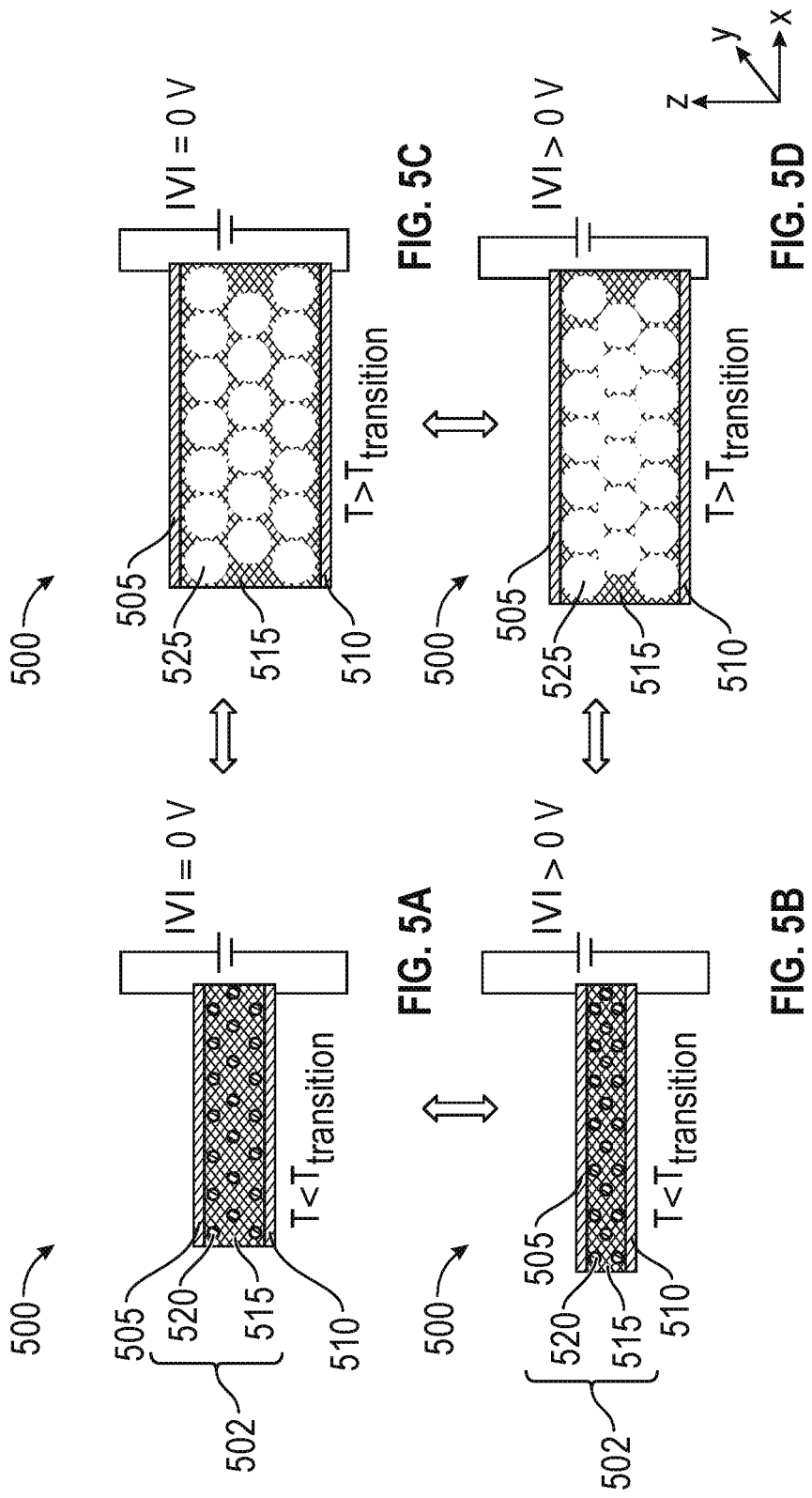

PHASE-CHANGE COMPOSITES FOR ELECTROACTIVE DEVICES

BACKGROUND

Electroactive polymer (EAP) materials may change their shape under the influence of an electric field. EAP materials have been investigated for use in various technologies, including actuation, sensing and/or energy harvesting. Lightweight and conformable, electroactive polymers may be incorporated into wearable devices such as haptic devices and are attractive candidates for emerging technologies including virtual reality/augmented reality devices where a comfortable, adjustable form factor is desired.

Virtual reality (VR) and augmented reality (AR) eyewear devices or headsets, for instance, may enable users to experience events, such as interactions with people in a computer-generated simulation of a three-dimensional world or viewing data superimposed on a real-world view. VR/AR eyewear devices and headsets may also be used for purposes other than recreation. For example, governments may use such devices for military training, doctors may use such devices to simulate surgery, and engineers may use such devices as design visualization aids.

These and other applications that use an electroactive polymer-containing electroactive device leverage the Poisson's ratio of the polymer material to generate lateral expansion as a response to compression between conductive electrodes. The deformation may be used to actuate deformable optical elements in an optical assembly, such as a lens system. In this regard, conventional voltage-stimulated electroactive polymer materials may exhibit rapid and efficient switching between un-deformed and deformed states. However, the amplitude of the deformation and the attendant stress may be limited by the deformation mechanism. It would therefore be advantageous to provide an electroactive device that enables large deformation amplitudes and stresses without unduly compromising switching frequency and efficiency.

SUMMARY

As will be described in greater detail below, the instant disclosure relates to an electroactive device having an electroactive polymer element that includes a composite polymer material. The composite polymer material may include a polymer matrix and inclusions of a deformable medium, e.g., a phase change material (PCM), dispersed throughout the matrix.

According to some embodiments, a device may include a primary electrode, a secondary electrode overlapping at least a portion of the primary electrode, and an electroactive polymer element including a composite polymer material disposed between and abutting the primary electrode and the secondary electrode. The composite polymer material may include a polymer matrix and inclusions of a deformable medium such as a liquid, a gas, or a liquid-gas mixture dispersed throughout the polymer matrix. In some embodiments, the deformable medium may be adapted to undergo a reversible volume change. In certain embodiments, the deformable medium may be a phase change material that is adapted to undergo a reversible volume change incident to a phase transformation.

The electroactive polymer element may have a thickness of 100 nanometers to 10 micrometers and may further include particles of a material having a high dielectric constant, such as barium titanate. The high dielectric constant particles may have an average diameter between approximately 10 nm and approximately 1000 nm.

Inclusions within the composite polymer material may be interconnected or mutually isolated. In certain embodiments, the inclusions may include a high dielectric strength fluid. In certain embodiments, the inclusions may include a liquid such an alcohol, glycol, water, paraffin, trimethylolethane, lauric acid, a solution of a carbonate compound, or a solution of a peroxide compound and/or a gas such as nitrogen, oxygen, argon, or sulfur hexafluoride, as well as combinations thereof. An electroactive device having an electroactive polymer element that includes such a composite polymer material may exhibit three or more of the following characteristics: (i) an actuation frequency of at least 1 MHz, (ii) an actuation efficiency of at least 20%, (iii) an actuation amplitude of at least 100%, and (iv) an actuation stress of at least 1 MPa.

In further embodiments, a method may include forming a primary electrode, forming an electroactive polymer element including a composite polymer material directly over the primary electrode, and forming a secondary electrode opposite the primary electrode and directly over the electroactive polymer element, where the composite polymer material may include inclusions of a deformable medium dispersed throughout the polymer material. During operation, a dimension of the electroactive polymer element may be changed by applying a voltage between the primary electrode and the secondary electrode, exposing the deformable medium to a source of radiation and/or by changing a temperature or pressure of the deformable medium.

Features from any of the embodiments disclosed herein may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of exemplary embodiments and are a part of the specification. Together with the following description, these drawings demonstrate and explain various principles of the instant disclosure.

FIG. 2 shows a schematic diagram of an example composite polymer including a network of mutually-isolated inclusions within a polymer matrix according to some embodiments of the disclosure.

FIG. 3 shows a schematic diagram of an example composite polymer including a network of interconnected inclusions within a polymer matrix according to some embodiments of the disclosure.

FIG. 4A shows a diagram of another example electroactive device having a composite electroactive polymer element, in accordance with some embodiments of the disclosure.

FIG. 4B shows a diagram of the example electroactive device of FIG. 4A in a compressed state, in accordance with some embodiments of the disclosure.

FIG. 5A shows a schematic cross-sectional diagram of an example electroactive device in an unstressed state including an electroactive polymer element having a composite polymer material with inclusions of a deformable medium distributed throughout a polymer matrix, in accordance with some embodiments of the disclosure.

FIG. 5B shows a schematic cross-sectional diagram of the electroactive device of FIG. 5A following the application of a voltage across the electroactive polymer element, in accordance with some embodiments of the disclosure.

FIG. 5C shows a schematic cross-sectional diagram of the electroactive device of FIG. 5A in response to heating the electroactive polymer element to a temperature greater than a transition temperature of the deformable medium, in accordance with various embodiments of the disclosure.

FIG. 5D shows a schematic cross-sectional diagram of the electroactive device of FIG. 5A following heating of the electroactive polymer element and the application of a voltage across the electroactive polymer element, in accordance with some embodiments of the disclosure.

Figure 1:
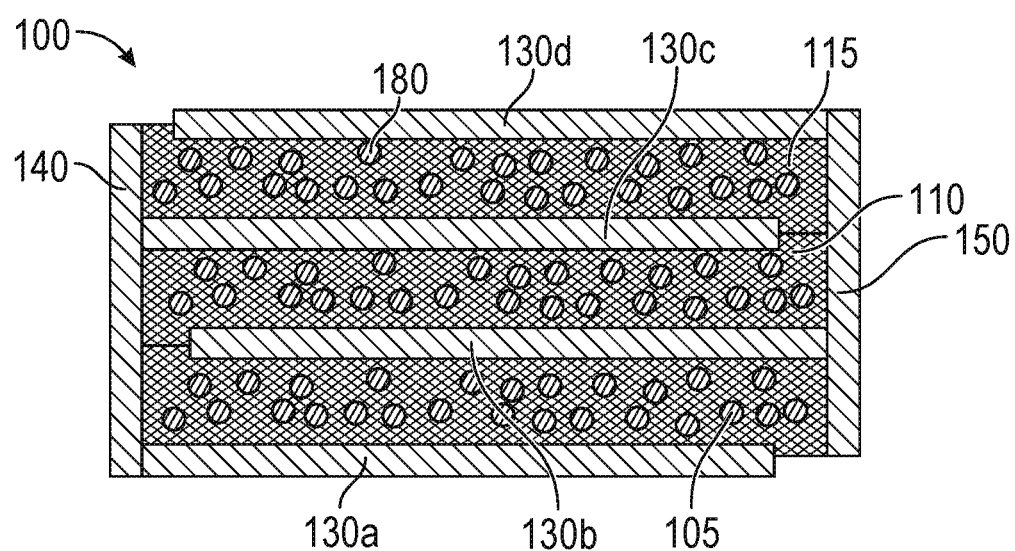
FIG. 1 shows a schematic diagram of an example electroactive device (e.g., an actuator, sensor, or an energy harvesting device) including an electroactive polymer element having randomly-distributed inclusions of a deformable medium dispersed throughout a polymer matrix in accordance with some embodiments of the disclosure.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION OF EXEMPLARY EMBODIMENTS

The present disclosure is generally directed to electroactive devices and more particularly to electroactive devices that may be thermally as well as electrically actuated. As will be explained in greater detail below, a device may include a primary electrode, a secondary electrode overlapping at least a portion of the primary electrode, and an electroactive polymer element including a composite polymer material disposed between and abutting the primary electrode and the secondary electrode. The composite polymer material may include a polymer matrix and inclusions of a deformable medium dispersed throughout the polymer matrix. By way of example, the composite polymer material may include a matrix material formed of a dielectric elastomer and inclusions of a liquid, a gas, or a liquid-gas mixture disposed within the elastomer. According to certain embodiments, the deformable medium may include a phase change material. According to certain embodiments, the deformable medium is not a solid.

As will be explained in greater detail below, the incorporation of a deformable medium within the electroactive polymer element may enable thermal actuation of the device. Thus, such a device may be actuated via the application of a voltage between the primary and secondary electrodes, which can induce a Maxwell stress that acts on the electroactive polymer element and/or by heating or cooling about a transition temperature, e.g., a vaporization temperature of the deformable medium, which can induce a volume change in the deformable medium and an attendant deformation of the electroactive polymer element. Further methods of actuation include exposure to a source of radiation and the application of pressure to the deformable medium.

In certain embodiments, the deformable medium may be configured to undergo a reversible volume change, e.g., a reversible phase change, within the matrix of the composite polymer material. As used herein, an electroactive device actuated using an applied voltage may be referred to as a dielectric elastomer actuator (DEA) and an electroactive device actuated by radiation exposure or by increasing or decreasing a temperature or pressure of the device may be referred to as a soft actuator.

In some embodiments, device actuation via a temperature-, pressure- or radiation-driven mechanism in conjunction with a voltage-driven mechanism may enable the realization of a combination of device attributes not achievable by any one actuation mechanism. Exemplary attributes include an actuation frequency of at least 1 MHz, an actuation efficiency of at least 20%, an actuation amplitude of at least 100%, and actuation stress of at least 1 MPa.

According to certain embodiments, the application of a voltage (e.g., DC voltage) and the exposure to radiation or the change in temperature or pressure may be performed simultaneously and/or in succession. For instance, in some embodiments, a voltage may be applied between the primary electrode and the secondary electrode followed by heating or cooling of the device, where the applied voltage is optionally maintained during the heating or cooling. In a further example, a device may be heated or cooled, and a voltage applied between the primary and the secondary electrode, e.g., during the entire heating or cooling step, during a portion of the heating or cooling step, or following the step of heating or cooling.

As described herein, and in accordance with various embodiments, electroactive devices may be used to actuate deformable optical elements in optical assemblies (e.g., lens systems). Such electroactive devices may convert electrical energy to mechanical energy (e.g., an actuator), but may also be configured to convert mechanical energy to electrical energy (e.g., an energy harvesting device). Examples of electroactive devices include, without limitation, actuators, sensors, microelectromechanical devices, and/or any other suitable devices.

In various embodiments, electroactive devices may include an electroactive polymer element including a composite polymer material that is disposed between paired electrodes. The electrodes may allow the creation of the electrostatic field that forces constriction of the electroactive polymer in accordance with some methods of actuation. Such electrodes may include relatively thin, electrically conductive layers or structures and may be of a non-compliant or compliant nature.

Any suitable materials may be utilized in the electrodes, including electrically conductive materials suitable for use in thin film electrodes, such as, for example, transparent conductive oxides, aluminum, silver, indium, gallium, zinc, carbon nanotubes, carbon black, and/or any other suitable materials formed by vacuum deposition, spray-coating, dip-coating and/or any other suitable technique either on a non-electroactive polymer layer or directly on the electroactive polymer surface itself. In some examples, an "electrode," as used herein, may refer to a conductive material, usually a thin film or a layer.

An electrode may be self-healing, such that when an area of an active layer (e.g., an electroactive polymer element) shorts out, the electrode may be able to isolate the damaged area. Suitable self-healing electrodes may include thin films of metals, such as, for example, aluminum.

In some embodiments, an electroactive device may include a stack of at least two electroactive polymer elements (e.g., elastomeric polymer elements) that are layered, with electrodes abutting opposing surfaces of each of the electroactive polymer elements. In some embodiments, the electroactive polymer elements may be electrically driven by adjacent, opposing pairs of electrodes. As described below, electrodes may optionally be electrically connected to at least one adjacent common electrode extending along a lateral periphery of the stack via at least one contact layer.

As used herein, "electroactive polymers" refers to polymers that may exhibit a change in size or shape when stimulated by an electric field. In some examples, an electroactive polymer may include a deformable polymer matrix that may be symmetric with regard to electrical charge (e.g., polydimethylsiloxane (PDMS) acrylates, etc.) or asymmetric (e.g., poled polyvinylidene fluoride (PVDF) or its co-polymers such as poly(vinylidenefluoride-co-trifluoroethylene) (PVDF-TrFE)). Additional examples of polymer materials forming electroactive polymer materials may include, without limitation, styrenes, polyesters, polycarbonates, epoxies, halogenated polymers, such as PVDF, co-polymers of PVDF, such as PVDF-TrFE, silicone polymers, and/or any other suitable polymer materials. Such materials may have any suitable dielectric constant or relative permittivity, such as, for example, a dielectric constant ranging from approximately 1.2 to approximately 30.

In certain embodiments, an electroactive polymer may include a plurality of voids, e.g., nanovoids, dispersed throughout the polymer matrix. The voids and/or nanovoids may be any suitable size and, in some embodiments, the voids may approach the scale of the thickness of the polymer layer in an undeformed state. For example, the voids may be between approximately 10 nm to about equal to the gap between respective pairs of electrodes. In some embodiments, the voids may be between approximately 10 nm and approximately 1000 nm, such as between approximately 10 and approximately 200 nm (e.g., approximately 10 nm, approximately 20 nm, approximately 30 nm, approximately 40 nm, approximately 50 nm, approximately 60 nm, approximately 70 nm, approximately 80 nm, approximately 90 nm, approximately 100 nm, approximately 110 nm, approximately 120 nm, approximately 130 nm, approximately 140 nm, approximately 150 nm, approximately 160 nm, approximately 170 nm, approximately 180 nm, approximately 190 nm, approximately 200 nm, approximately 250 nm, approximately 300 nm, approximately 400 nm, approximately 500 nm, approximately 600 nm, approximately 700 nm, approximately 800 nm, approximately 900 nm, or approximately 1000 nm, including ranges between any of the foregoing values).

In some embodiments, the voids may occupy at least approximately 10% of the volume of an electroactive polymer element (e.g., approximately 10% by volume, approximately 20% by volume, approximately 30% by volume, approximately 40% by volume, approximately 50% by volume, approximately 60% by volume, approximately 70% by volume, approximately 80% by volume, approximately 90% by volume, including ranges between any of the foregoing values).

According to some embodiments, a deformable medium may be dispersed throughout the polymer matrix material as inclusions within the electroactive polymer element. For instance, the deformable medium may be disposed within the voids of the electroactive polymer element. The deformable medium may be configured to expand or contract with changing temperature or pressure, or upon exposure to a source of radiation, and may include a phase change material.

Example deformable media include organic phase change materials such as paraffin, hydrocarbons such as trimethylolethane (TME), and lauric acid, and eutectic phase change materials such as water and glycol, as well as combinations thereof. In certain embodiments, a paraffinic phase change material, for instance, may have a phase change temperature of about −5° C. to about 80° C. Hydrocarbon materials, in addition to a reversible liquid-vapor phase change, may provide an irreversible volume change incident to combustion. Further example deformable media include aqueous solutions of suitable carbonate salts, such as ammonium bicarbonate and sodium bicarbonate, and peroxide compounds, which may decompose to produce free radicals that can induce further reactions. In certain embodiments, the deformable medium may include a high dielectric strength fluid.

In the presence of an electrostatic field, radiation exposure, or changing temperature or pressure, an electroactive polymer may deform (e.g., compress, elongate, bend, etc.) according to the magnitude and/or direction of that field or the extent of the temperature change. Generation of such a field may be accomplished, for example, by placing the electroactive polymer between two electrodes, each of which is at a different potential. As the potential difference (i.e., voltage difference) between the electrodes is increased or decreased (e.g., from zero potential) the amount of deformation may also increase, principally along electric field lines. This deformation may achieve saturation when a certain electrostatic field strength has been reached. With no electrostatic field, the electroactive polymer may be in its relaxed state undergoing no induced deformation, or stated equivalently, no induced strain, either internal or external.

The physical origin of the compressive nature of electroactive polymers in the presence of an electrostatic field (E-field), being the force created between opposite electric charges, is that of the Maxwell stress, which is expressed mathematically with the Maxwell stress tensor. The level of strain or deformation induced by a given E-field is dependent on the square of the E-field strength, the dielectric constant of the electroactive polymer, and on the elastic compliance of the material in question. Compliance in this case is the change of strain with respect to stress or, equivalently, in more practical terms, the change in displacement with respect to force.

According to certain embodiments, voltage-driven device actuation can exhibit actuation frequencies greater than 500 kHz, e.g., ~1 MHz, with actuation efficiencies in excess of 20%. Notwithstanding the efficacy of voltage-based device actuation, some electroactive polymers may have limited applications due to a low breakdown voltage of the polymers with respect to the operating voltage used by electroactive devices (e.g., actuators) that use the polymers. With the achievable deformation generally proportional to voltage, the low breakdown voltage may limit the extent of the achievable strain, e.g., to values of 50% or 100%.

In some embodiments, the deformable medium may include an electrorheological fluid. Example electrorheological fluids may include a suspension of nanoparticles, such as metallic nanoparticles, in an oil. The application of a DC electric field on such a material may stiffen the electroactive polymer matrix and the superposition of an AC electric field may cause the electroactive polymer material to vibrate. The amplitude of the DC field may be used to modulate the resonant frequency, where greater DC fields induce a greater stiffness and a greater resonant frequency.

In some embodiments, the deformable medium may include a magnetorheological fluid or ferrofluid. Example magnetorheological fluids may include a suspension of magnetic particles in an oil. In conjunction with such materials, an applied magnetic field may facilitate remote stimulation, i.e., without requiring electrical contact. Additionally, in certain embodiments, the magnetic stimulation of a magnetorheological fluid or ferrofluid may be used in conjunction with the electrical stimulation of an electroactive polymer. For instance, the magnetic stimulation of a magnetorheological fluid or ferrofluid and the electric stimulation of an electroactive polymer may be performed simultaneously. These disparate interactions may be used to enhance or restrict actuation locally, for example, in order to improve the shape resolution of an electroactive device.

Thermal, radiative or mechanical actuation of electroactive polymers, optionally in conjunction with voltage-based actuation, may be used to achieve an actuation frequency of at least 1 MHz, an actuation efficiency of at least 20%, an actuation amplitude of at least 100%, and an actuation stress of at least 1 MPa. In certain embodiments, an electroactive device may exhibit an actuation frequency of approximately 1 MHz to approximately 10 MHz, e.g., approximately 1 MHz, approximately 2 MHz, approximately 5 MHz or approximately 10 MHz, including ranges between any of the foregoing values. The electroactive device may also exhibit an actuation efficiency of approximately 20% to approximately 50% and/or an actuation amplitude (strain) of approximately 10% to approximately 900%, e.g., approximately 10%, approximately 20%, approximately 50%, approximately 100%, approximately 200%, approximately 300%, approximately 400%, approximately 500%, approximately 600%, approximately 700%, approximately 800%, or approximately 900%, including ranges between any of the foregoing values.

In some embodiments, the electroactive polymer element may include a liquid crystal elastomer (LCE), which may deform in response to exposure to radiation, e.g., visible light or UV radiation. Suitable LCE materials may include slightly crosslinked liquid crystalline polymer networks. Example LCE thin films may be deposited from a mixture of mesogenic diacrylates with a dithiol chain transfer agent. The dithiol additive may decrease the crosslink density of the polyacrylate via chain transfer and/or chain extension. In such materials, molecular chains may reversibly crosslink in response to absorbed radiation, which may change the stiffness and/or volume of the electroactive polymer element.

Generation of a temperature change may be accomplished using a variety of techniques and methods including, for example, a thermoelectric generator, Peltier element, resistive heating, irradiation such as infrared, UV-visible, microwave or other types of irradiation, magnetic hyperthermia, and/or heat transfer across interfaces.

In various embodiments, the application of pressure may include the application of uniaxial, biaxial, or isostatic compression or tension, or the application of shear stress to the electroactive polymer element. In further embodiments, the application of pressure may include the application of a constant pressure or the application of variable pressure, e.g., through vibration of the electroactive polymer element.

The electroactive polymer element may further include optional components, such as fillers, plasticizers, compatibilizers, draw down polymers, processing aids, anti-blocking agents, viscosity-reducing polymer, and the like. Other additive may include pigments, dyes, antioxidants, antistatic agents, slip agents, foaming or anti-foaming agents, heat or light stabilizers, UV stabilizers, and the like.

In some embodiments, the composite polymer material may include particles of a material with a high dielectric constant (e.g., barium titanate). The particles may have an average diameter of between approximately 10 and approximately 1000 nm (e.g., between approximately 10 and approximately 100 nm, between approximately 20 and approximately 100 nm, and the like). The particles of the high dielectric constant material may be dispersed throughout the polymer material and/or incorporated into the voids of a nanovoided polymer material.

The methods and systems shown and described herein may be used to form electroactive devices having a single layer or multiple layers of an electroactive polymer (e.g., a few layers to tens, hundreds, or thousands of stacked layers). For example, an electroactive device may include a stack of from two electroactive polymer elements and corresponding electrodes to thousands of electroactive polymer elements (e.g., from 2 electroactive polymer elements to approximately 5, approximately 10, approximately 20, approximately 30, approximately 40, approximately 50, approximately 100, approximately 200, approximately 300, approximately 400, approximately 500, approximately 600, approximately 700, approximately 800, approximately 900, approximately 1000, approximately 2000, or greater than approximately 2000 electroactive polymer elements, including ranges between any of the foregoing values). A large number of layers may be used to achieve a higher displacement, where the overall device displacement may be expressed as the sum of the displacement of each layer. According to some embodiments, each of a plurality of electroactive polymer elements in a multi-layer stack may possess the same or different characteristics, including composition, geometry, spacing, and alignment in order to, for example, suitably stiffen, soften, bend, extend, compress, and/or twist the device.

As noted, the electroactive devices (e.g., actuators) may include at least a first conductive material and a second conductive material (e.g., serving as electrodes). Further, a composite polymer material may be disposed between the first and the second conductive materials. In certain embodiments, the composite polymer material may include a nanovoided material where voids, e.g., nanovoids, are incorporated throughout the polymer matrix. A deformable medium may be disposed within the voids.

Methods of forming an electroactive device include forming electrodes and electroactive polymer materials sequentially (e.g., via vapor deposition, coating, printing, etc.) or simultaneously (e.g., via co-flowing, co-extrusion, slot die coating, etc.). Alternatively, the electroactive polymer materials may be deposited using initiated chemical vapor deposition (i-CVD), where, for example, suitable monomers of the desired polymers may be used to form the desired coating. In some embodiments, monomers, oligomers, prepolymers, and/or polymers for forming the electroactive polymer may optionally be mixed with a solvent and the solvent may be removed from the electroactive polymer during and/or following curing to form voids within the electroactive polymer. In certain embodiments, ordered arrays of voids may be formed by self-assembly of block co-polymers or by using photolithographic processes.

Figure 7:
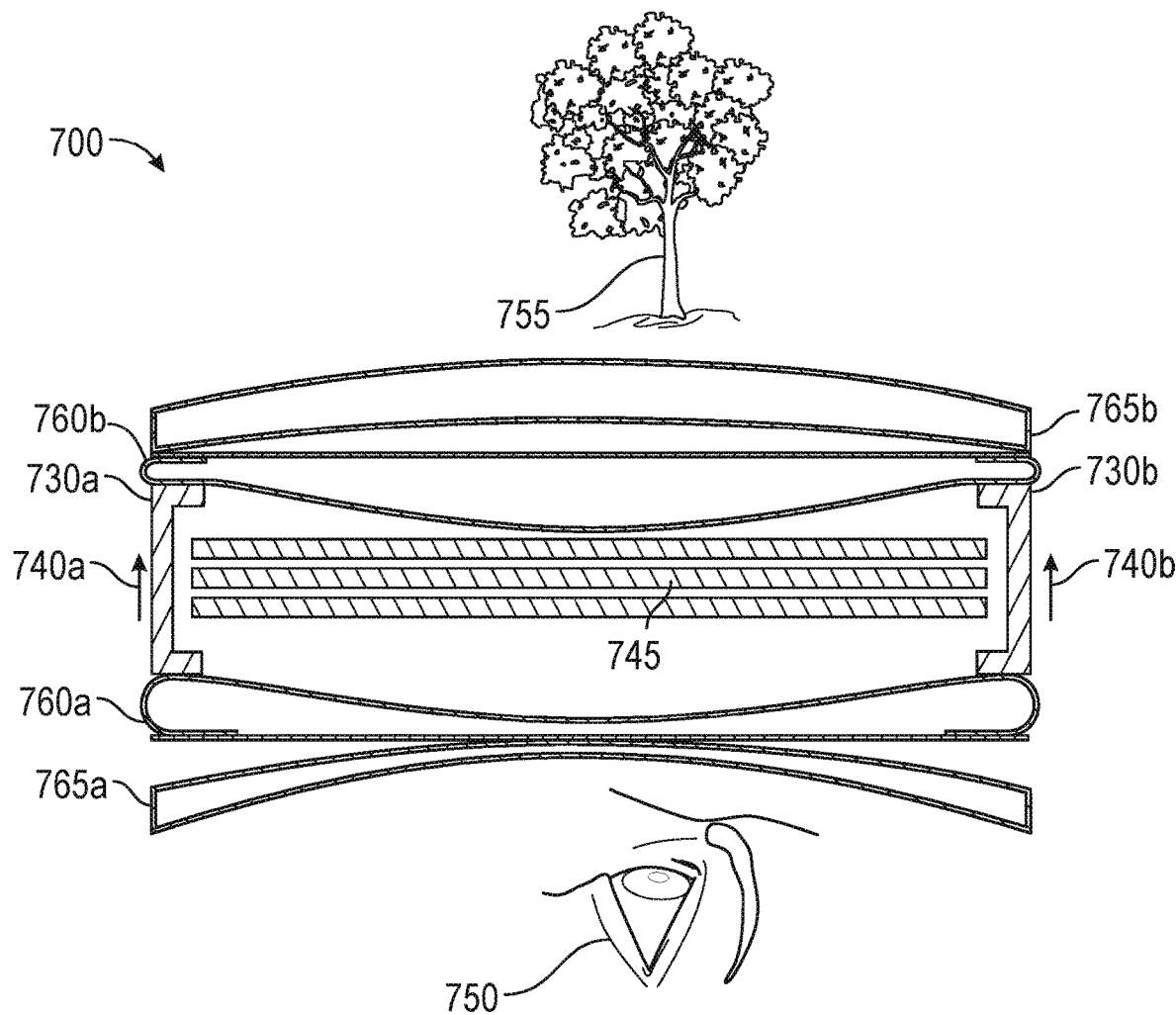
FIG. 7 shows a cross-sectional view of an example lens assembly device with multiple deformable elements (e.g., multiple liquid lenses) that may include electroactive devices, in accordance with some embodiments of the disclosure.
Figure 8:
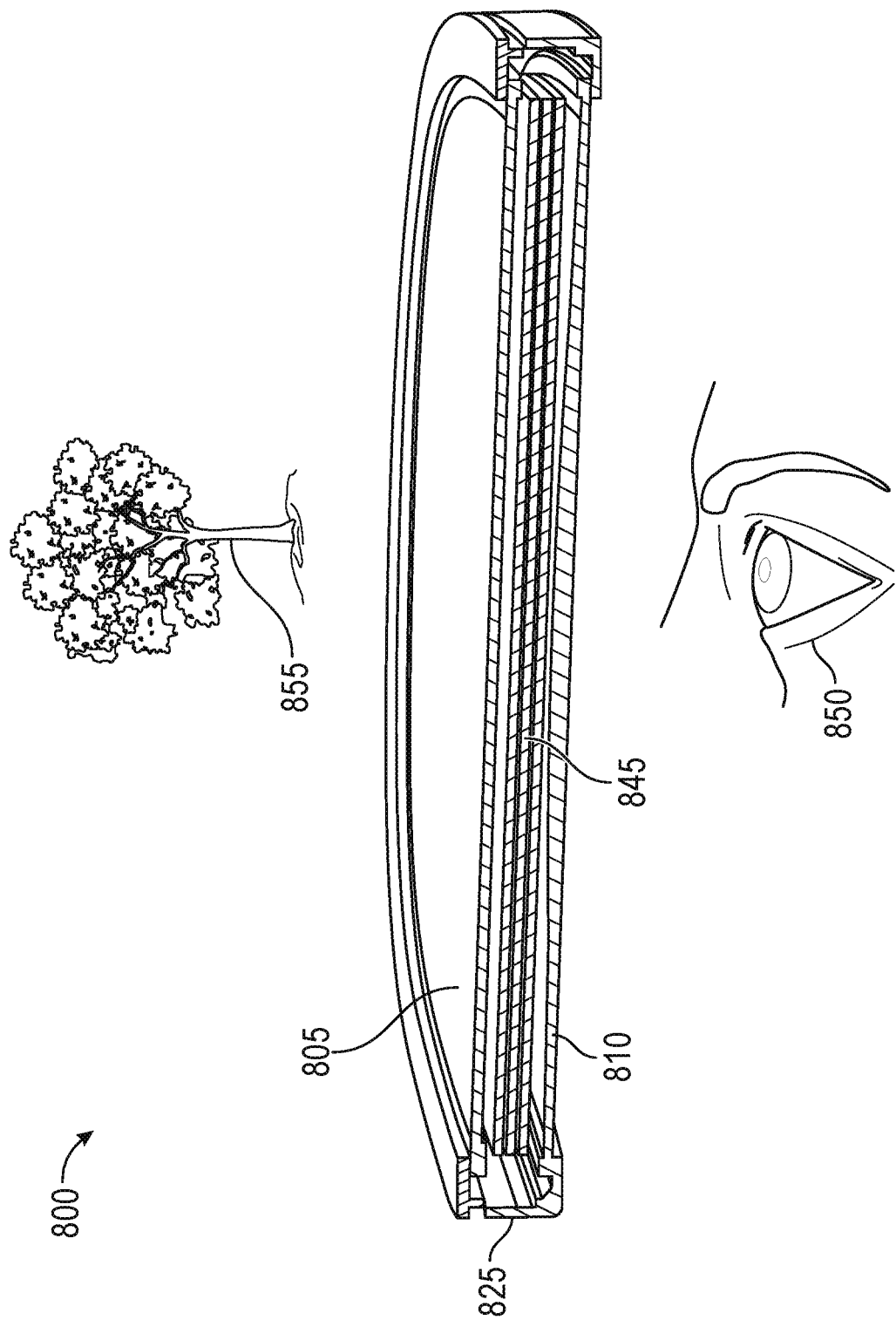
FIG. 8 shows another cross-sectional view of an example lens assembly device having multiple deformable elements and which may include electroactive devices, in accordance with some embodiments of the disclosure.
Figure 9:
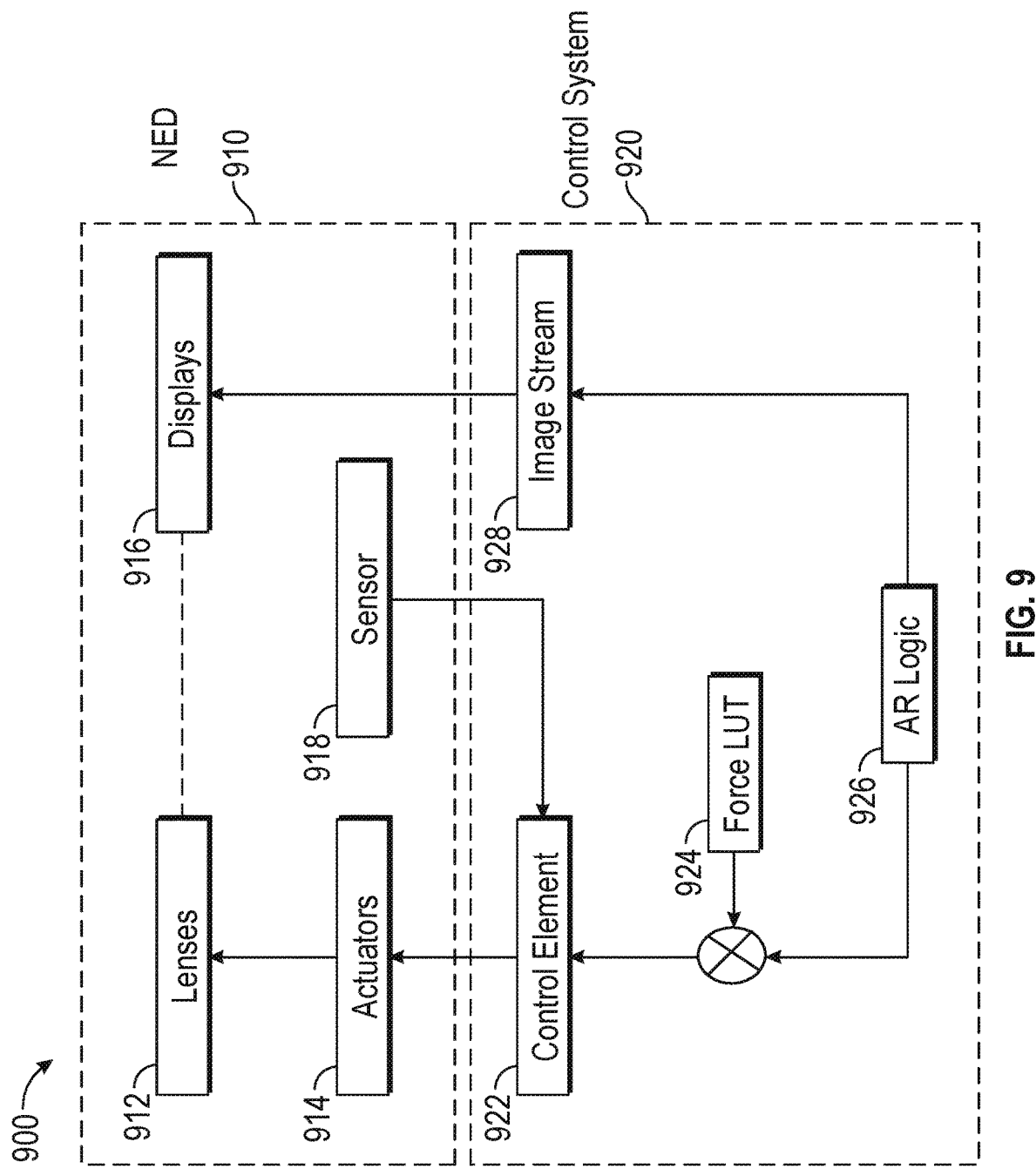
FIG. 9 shows a diagram of an example near-eye display system including a near-eye display and a control system, which may be communicatively coupled to each other, in accordance with some embodiments of the disclosure.
Figure 10:
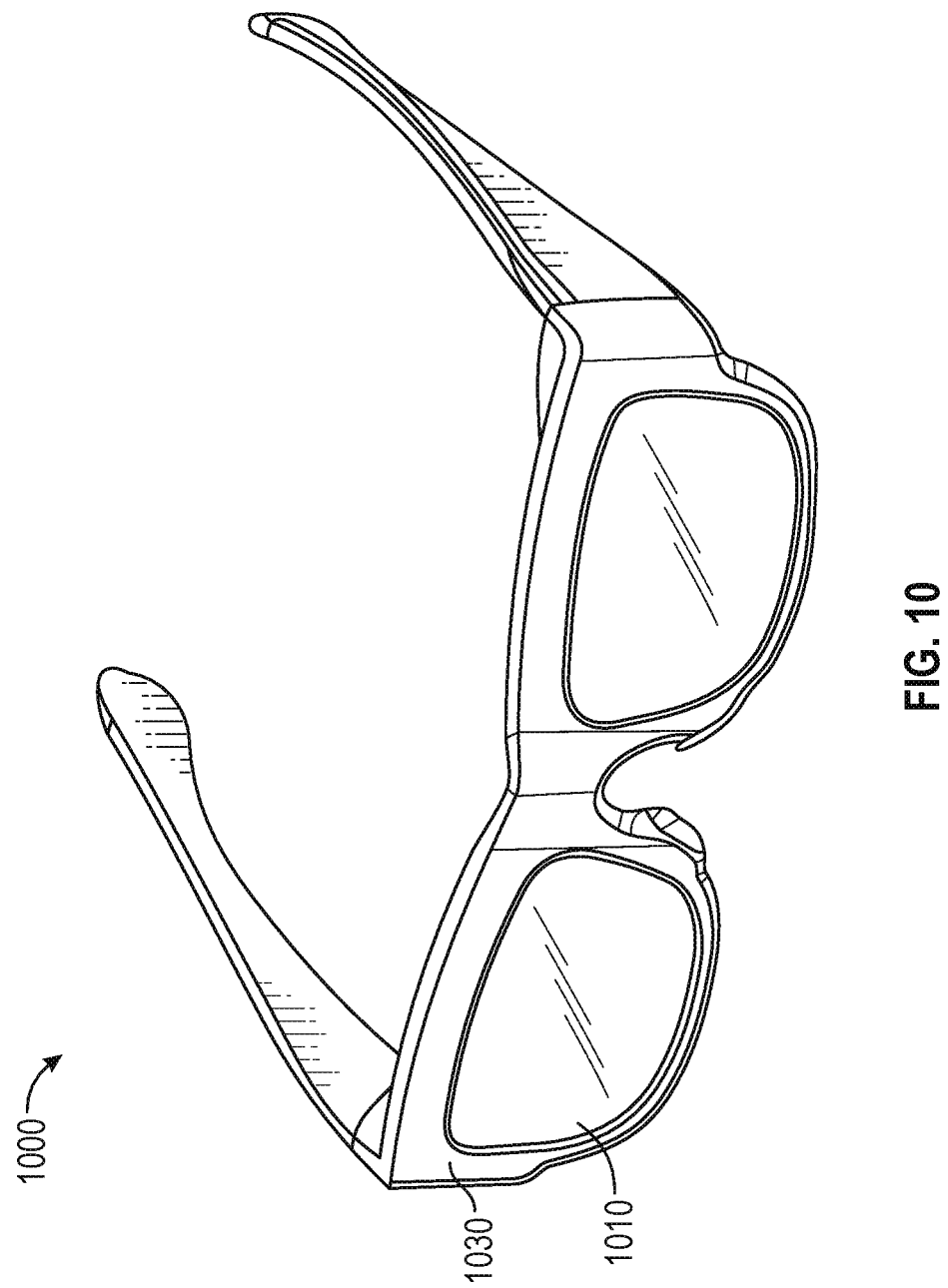
FIG. 10 shows a diagram of an example near-eye display having lenses including a lens assembly with multiple liquid lenses, in accordance with some embodiments of the disclosure.

The following will provide, with reference to FIGS. 1-11, detailed descriptions of systems, methods, and apparatuses for electroactive devices containing deformable media, and optical systems implementing electroactive devices (e.g., actuators) and the fabrication thereof. The discussion associated with FIGS. 1-3 includes a description of electroactive devices having an electroactive polymer element that may include a deformable medium dispersed throughout the electroactive polymer element in accordance with various embodiments. The discussion associated with FIGS. 4A, 4B and 5A-5D describes the deformation response of example electroactive polymer elements including a composite polymer material. The discussion relating to the embodiments depicted in FIGS. 6A and 6B includes descriptions of example deformable element (e.g., liquid lens) designs and devices incorporating the electroactive devices. The discussion relating to the embodiments depicted in FIGS. 7 and 8 describes lens assembly devices including the nanovoid-containing electroactive devices. The discussion relating to the embodiment depicted in FIG. 9 shows a diagram for a near-eye display and control system, in accordance with example embodiments of the disclosure. The discussion relating to the embodiment depicted in FIG. 10 shows an example near-eye display having lenses that may be actuated with the disclosed electroactive devices. Detailed descriptions of methods for fabricating electroactive devices will be provided in connection with FIG. 11. While many of the examples discussed herein may be directed to head-worn display systems, embodiments of the instant disclosure may be implemented in a variety of different types of devices and systems.

According to various embodiments, an electroactive device may include overlapping primary and second electrodes and an electroactive polymer element including a composite polymer material disposed between and abutting the electrodes. The application of a voltage (e.g., DC voltage) between the electrodes, exposure to radiation and/or a change in temperature or pressure of the deformable media disposed within the polymer matrix may induce a stress that acts on the electroactive polymer element. The incorporation of the deformable medium within the polymer material can alter the stress-strain behavior relative to bulk electroactive polymers, which can be used to define the manner by which an EAP responds to radiation, mechanical, thermal and/or biased actuation.

As noted, electroactive devices may include actuators that include electroactive polymers. In some embodiments, inclusions of a deformable media are disposed throughout the polymer matrix. In some embodiments, the electroactive devices may include at least two polymer layers, with each layer being driven by a pair of electrodes. FIG. 1 shows an example electroactive device (e.g., an actuator) 100 with a first composite electroactive polymer element (e.g., a first elastomer material) 105, a second composite electroactive polymer element (e.g., a second elastomer material) 110, a third composite electroactive polymer element (e.g., a third elastomer material) 115, a primary electrode 130a, a secondary electrode 130b, a tertiary electrode 130c, and a quaternary electrode 130d. Illustrated is an exemplary compressive EAP stack actuator with micro- and nano-scale modification through the incorporation of inclusions 180 of a deformable medium. The inclusions 180 are dispersed throughout the first, second, and third elastomeric materials.

In some embodiments, the primary electrode 130a and the tertiary electrode 130c may be connected to a primary common electrode 140, and the secondary electrode 130b and the quaternary electrode 130d may be connected to a secondary common electrode 150 that is electrically isolated from the primary common electrode 140.

In some embodiments, the electrodes 130a, 130b, 130c, 130d may be spaced away from one other and at least partially overlap in a horizontal direction. In some embodiments, the secondary electrode 130b may overlap (i.e., overlap in a horizontal direction) at least a portion of the primary electrode 130a, the tertiary electrode 130c may overlap at least a portion of the secondary electrode 130b, and the quaternary electrode 130d may overlap at least a portion of the tertiary electrode 130c.

The first electroactive polymer element 105 may include a first elastomer material disposed between and abutting the primary electrode 130a and the secondary electrode 130b. The second electroactive polymer element 110 may include a second elastomer material disposed between and abutting the secondary electrode 130b and the tertiary electrode 130c. The third electroactive polymer element 115 may include a third elastomer material disposed between and abutting the tertiary electrode 130c and the quaternary electrode 130d. In some embodiments, the primary common electrode 140 may be electrically coupled (e.g., electrically contacted at an interface having a low contact resistance) to the primary electrode 130a and the tertiary electrode 130c. The secondary common electrode 150 may be electrically coupled to the secondary electrode 130b and the quaternary electrode 130d.

In some embodiments, the electroactive device 100 may include additional layers that are not shown in FIG. 1. For example, an additional electroactive polymer element (not shown) may be disposed on a side of the quaternary electrode 130d opposite the third electroactive polymer element 115. The additional electroactive polymer element may overlie the first electroactive polymer element 105, the second electroactive polymer element 110, and the third electroactive polymer element 115.

Furthermore, an additional electrode (not shown) may be disposed abutting a surface of the additional electroactive polymer element that faces away from the third electroactive polymer element 115. In some embodiments, the electroactive device 100 may include more (e.g., two, three, or more) such additional electroactive polymer elements and corresponding electrodes. For example, an electroactive device may include a stack of from two electroactive polymer elements and corresponding electrodes to thousands of electroactive polymer elements (e.g., from 2 electroactive polymer elements to approximately 5, approximately 10, approximately 20, approximately 30, approximately 40, approximately 50, approximately 100, approximately 200, approximately 300, approximately 400, approximately 500, approximately 600, approximately 700, approximately 800, approximately 900, approximately 1000, approximately 2000, greater than approximately 2000 electroactive polymer elements, including ranges between any of the foregoing values).

In some embodiments, as used herein, an "elastomer material" may refer to a polymer with viscoelasticity (i.e., both viscosity and elasticity) and relatively weak intermolecular forces, and generally low elastic modulus (a measure of the stiffness of a solid material) and high failure strain compared with other materials. In some embodiments, the electroactive polymer elements (e.g., the first electroactive polymer element 105, the second electroactive polymer element 110, and the third electroactive polymer element 115) may include an elastomer material that may exhibit an effective Poisson's ratio of less than approximately 0.35 (e.g., 0.35, 0.3, 0.25, 0.2, 0.15, 0.1, or 0.05, including ranges between any of the foregoing values).

In at least one example, the elastomer material may have an effective density that is less than approximately 90% (e.g., less than approximately 80%, less than approximately 70%, less than approximately 60%, less than approximately 50%, less than approximately 40%) of the elastomer when densified (e.g., when the elastomer is compressed, for example, by electrodes to make the elastomer denser).

In some examples, the term "effective density," as used herein, may refer to a parameter that may be obtained using a test method where a uniformly thick layer of the elastomer may be placed between two flat and rigid circular plates. In some embodiments, the diameter of the elastomer material being compressed may be at least 100 times the thickness the elastomer material. The diameter of the elastomer material may be measured, then the plates may be pressed together to exert a pressure of at least approximately $1 \times 10^6$ Pa on the elastomer, and the diameter of the elastomer is remeasured. The effective density may be determined from the following expression: $D_{ratio} = D_{uncompressed}/D_{compressed}$, where $D_{ratio}$ may represent the effective density ratio, $D_{uncompressed}$ may represent the density of the uncompressed polymer, and $D_{compressed}$ may represent the density of the uncompressed polymer.

In some examples, the electroactive polymer elements (e.g., the first electroactive polymer element 105, the second electroactive polymer element 110 and the third electroactive polymer element 115) may be voided and/or nanovoided (i.e., having a plurality of voids such as nano-sized voids in the material composing the electroactive polymer element), where the deformable medium may be contained within the voids and/or nanovoids to form inclusions. In some embodiments, the nanovoids and hence the inclusions 180 of the deformable medium may occupy at least approximately 10% of the volume of the electroactive polymer elements (e.g., approximately 10% by volume, approximately 20% by volume, approximately 30% by volume, approximately 40% by volume, approximately 50% by volume, approximately 60% by volume, approximately 70% by volume, approximately 80% by volume, or approximately 90% by volume, including ranges between any of the foregoing values).

The voids and/or nanovoids may be either closed- or open-celled, or a combination thereof. For open-celled voids, the void size may be the minimum average diameter of the cell. In some embodiments, the polymer layer may include a thermoset material and/or any other suitable material having an elastic modulus of less than approximately 10 GPa (e.g., less than approximately 0.5, 1, 2, 3, 4, 5, 6, 7, 8, or 9 GPa, including ranges between any of the foregoing values).

According to some embodiments, inclusions of a deformable medium may be distributed homogeneously or non-homogeneously throughout the polymer material. In embodiments where a thermally deformation material is disposed within voids and/or nanovoids, the voids and/or nanovoids may be any suitable size and, in some embodiments, the voids may approach the scale of the thickness of the polymer layer in the undeformed state. For example, the voids may be between approximately 10 nm to about equal to the gap between respective pairs of electrodes. In some embodiments, the inclusions may be between approximately 10 nm and approximately 1000 nm, such as between approximately 10 and approximately 200 nm (e.g., approximately 10 nm, approximately 20 nm, approximately 30 nm, approximately 40 nm, approximately 50 nm, approximately 60 nm, approximately 70 nm, approximately 80 nm, approximately 90 nm, approximately 100 nm, approximately 110 nm, approximately 120 nm, approximately 130 nm, approximately 140 nm, approximately 150 nm, approximately 160 nm, approximately 170 nm, approximately 180 nm, approximately 190 nm, approximately 200 nm, approximately 250 nm, approximately 300 nm, approximately 400 nm, approximately 500 nm, approximately 600 nm, approximately 700 nm, approximately 800 nm, approximately 900 nm, or approximately 1000 nm, including ranges between any of the foregoing values).

According to some embodiments, inclusions of a deformable medium may be mutually-isolated or interconnected. By way of example, a nanovoided polymer material 260 including a network of mutually-isolated oval inclusions 280 is shown schematically in FIG. 2, while a nanovoided polymer material 360 including a network of interconnected oval inclusions 380 is shown schematically in FIG. 3.

In certain embodiments, the first electroactive polymer element 105 may be deformable from an initial state to a deformed state when a first voltage is applied between the primary electrode 130*a* and the secondary electrode 130*b*. Moreover, the second electroactive polymer element 110 may be deformable, in conjunction with deformation of the first electroactive polymer element 105, from an initial state to a deformed state when a second voltage is applied between the secondary electrode 130*b* and the tertiary electrode 130*c*, and the third electroactive polymer element 115 may be deformable, in conjunction with deformation of the first and second electroactive polymer elements 105, 110, from an initial state to a deformed state when a third voltage is applied between the tertiary electrode 130*c* and the quaternary electrode 130*d*. The first, second, and third voltages may be equal or unequal.

Prior to, during, and/or subsequent to the application of first, second, and third voltages, the first, second and third electroactive polymer elements 105, 110, 115 may be deformable by exposing the first, second and third electroactive polymer elements 105, 110, 115, to a source of radiation, i.e., exposing the deformable media embedded therein to a source of radiation.

In some embodiments, applying the voltage to the electrodes (e.g., the primary electrode 130*a*, the secondary electrode 130*b*, the tertiary electrode 130*c* and/or the quaternary electrode 130*d*) and/or exposing the first electroactive polymer element 105, the second electroactive polymer element 110 and/or the third electroactive polymer elements 115 to a source of radiation, may create at least approximately 10% strain in the electroactive polymer element(s) in at least one direction (e.g., an x, y, or z direction with respect to a defined coordinate system).

Prior to, during, and/or subsequent to the application of first, second, and third voltages, the first, second and third electroactive polymer elements 105, 110, 115 may be deformable by increasing or decreasing a temperature of the first, second and third electroactive polymer elements 105, 110, 115, respectively, i.e., increasing or decreasing a temperature of the deformable media embedded therein.

In some embodiments, applying the voltage to the electrodes (e.g., the primary electrode 130a, the secondary electrode 130b, the tertiary electrode 130c and/or the quaternary electrode 130d) and/or increasing or decreasing the temperature of the first electroactive polymer element 105, the second electroactive polymer element 110 and/or the third electroactive polymer elements 115, may create at least approximately 10% strain in the electroactive polymer element(s) in at least one direction (e.g., an x, y, or z direction with respect to a defined coordinate system).

Prior to, during, and/or subsequent to the application of first, second, and third voltages, the first, second and third electroactive polymer elements 105, 110, 115 may be deformable by increasing or decreasing a pressure exerted on the first, second and third electroactive polymer elements 105, 110, 115, respectively, i.e., increasing or decreasing the pressure exerted on the deformable media embedded therein.

In some embodiments, applying the voltage to the electrodes (e.g., the primary electrode 130a, the secondary electrode 130b, the tertiary electrode 130c and/or the quaternary electrode 130d) and/or increasing or decreasing the pressure exerted on the first electroactive polymer element 105, the second electroactive polymer element 110 and/or the third electroactive polymer elements 115, may create at least approximately 10% strain in the electroactive polymer element(s) in at least one direction (e.g., an x, y, or z direction with respect to a defined coordinate system).

In some embodiments, voids and/or nanovoids with the composite polymer material may be filled with a gas to suppress electrical breakdown of the electroactive polymer element (for example, during voltage-induced deformation). The gas may include air, nitrogen, oxygen, argon, sulfur hexafluoride and/or any suitable gas. In another embodiment, the electroactive device (e.g., an actuator) 100 may have a sealing layer (not shown) applied to the edges of the electroactive device 100, and/or to one or more of the electrodes, or a combination thereof. Suitable sealing layers may include thin film layers of an inorganic material, such as silica, applied with any suitable method, including, for example, atomic layer deposition (ALD), physical vapor deposition (PVD), chemical vapor deposition (CVD), or the like. The thin film layers may also be made from one or more dyads of a polymer layer and an inorganic layer. In an embodiment, the sealing layer may also include a barrier material, such as polychlorotrifluoroethylene (PCTFE) and/or other polymer, applied by solvent and/or with initiated-CVD.

In some embodiments, each of the electroactive polymer elements 105, 110, 115 may independently have a maximum thickness in an undeformed state and a compressed thickness in the deformed state. By way of example, the first elastomer material may have a density, when the first electroactive polymer element 105 is in the undeformed state, that is approximately 90% or less of a density of the first elastomer material when the first electroactive polymer element 105 is in the deformed state. The second elastomer material may have a density, when the second electroactive polymer element 110 is in the undeformed state, that is approximately 90% or less of a density of the second elastomer material when the second electroactive polymer element 110 is in the deformed state. The third elastomer material may have a density, when the third electroactive polymer element 115 is in the undeformed state, that is approximately 90% or less of a density of the third elastomer material when the third electroactive polymer element 115 is in the deformed state.

In some embodiments, the first elastomer material may exhibit a compressive strain of at least approximately 10% when a voltage is applied between the primary electrode 130a and the secondary electrode 130b and/or when the first electroactive polymer element 105 is heated or cooled, the second elastomer material may exhibit a compressive strain of at least approximately 10% when a voltage is applied between the secondary electrode 130b and the tertiary electrode 130c and/or when the second electroactive polymer element 110 is heated or cooled, and the third elastomer material may exhibit a compressive strain of at least approximately 10% when a voltage is applied between the tertiary electrode 130c and the quaternary electrode 130d and/or when the third electroactive polymer element 115 is heated or cooled.

In some embodiments, one or more of the electroactive polymer elements 105, 110, 115 may include particles of a material having a high dielectric constant, the particles having an average diameter between approximately 10 nm and approximately 1000 nm. In some embodiments, the material having the high dielectric constant may include barium titanate ($BaTiO_3$), which is a member of the perovskite family and which may also include other titanates. The material having the high dielectric constant may be disposed within voids and/or throughout the matrix of the nanovoided polymer material.

$BaTiO_3$ is a ferroelectric material with a relatively high polarization and dielectric constant (e.g., a value of between approximately 500 and approximately 7000) and may be used in various electroactive devices described herein. Besides large polarizability and permittivity, large strains may also be achievable with $BaTiO_3$. Pure $BaTiO_3$ is an insulator whereas upon doping it may transform into a semiconductor in conjunction with the polymer material. In some embodiments, the particles of the materials having high dielectric constant may be included in the polymer to modify a mechanical (e.g., a Poisson's ratio) or electrical property (resistance, capacitance, etc.) of the first electroactive polymer element 105, the second electroactive polymer element 110, or the third electroactive polymer element 115. Additionally or alternatively, any other suitable component may be added to the electroactive polymer material.

In some embodiments, the first electroactive polymer element 105, the second electroactive polymer element 110, the third electroactive polymer element 115 and/or the at least one additional electroactive polymer element (not shown) may have a thickness of approximately 10 nm to approximately 10 µm (e.g., approximately 10 nm, approximately 20 nm, approximately 30 nm, approximately 40 nm, approximately 50 nm, approximately 60 nm, approximately 70 nm, approximately 80 nm, approximately 90 nm, approximately 100 nm, approximately 200 nm, approximately 300 nm, approximately 400 nm, approximately 500 nm, approximately 600 nm, approximately 700 nm, approximately 800 nm, approximately 900 nm, approximately 1 µm, approximately 2 µm, approximately 3 µm, approximately 4 µm, approximately 5 µm, approximately 6 µm, approximately 7 µm, approximately 8 µm, approximately 9 µm, or approximately 10 µm, including ranges between any of the foregoing values), with an example thickness of approximately 200 nm to approximately 500 nm.

In some embodiments, the electroactive polymer elements 105, 110, 115 may include a first elastomer material, a second elastomer material, and a third elastomer material, respectively, each having a Poisson's ratio of approximately 0.35 or less.

In some embodiments, the first electroactive polymer element 105, the second electroactive element 110 and/or the third electroactive polymer element 115 may include particles of a material to assist the formation or to support the voided regions, or both. Suitable particles include a silicate, such as silica, including structures resulting from silica gels, fumed silica, a titanate, such as barium titanate, a metal oxide, such as titanium dioxide, composites thereof, and the like. The particles may have an average diameter between approximately 10 nm and approximately 1000 nm, and the particles may form branched or networked particles with average dimensions of between approximately 100 and approximately 10,000 nm.

In some embodiments, the common electrodes (e.g., the primary common electrode 140 and the secondary common electrode 150) may be structured in a number of different ways other than shown in FIG. 1. For example, the common electrodes may form a sloped shape, or may be a more complex shape (e.g., patterned or freeform). In some embodiments, the common electrodes may be shaped to allow compression and expansion of the electroactive device 100 during operation.

In some embodiments, the electrodes (e.g., the primary electrode 130a, the secondary electrode 130b, the tertiary electrode 130c, the quaternary electrode 130d, the primary common electrode 140, and the secondary common electrode 150) may include metals such as aluminum, gold, silver, tin, copper, indium, gallium, zinc, and the like. Other conductive materials may be used, including carbon nanotubes, graphene, transparent conductive oxides (TCOs, e.g., indium tin oxide (ITO), zinc oxide (ZnO), etc.), and the like.

In some configurations, the electrodes may be configured to stretch elastically. In such embodiments, the electrodes may include TCOs, graphene, carbon nanotubes, and the like. In other embodiments, for example, embodiments where electroactive devices have electroactive polymer elements including nanovoided electroactive polymer materials, relatively rigid electrodes (e.g. electrodes including a metal such as aluminum) may be used.

In some embodiments, the electrodes (e.g., the primary electrode 130a, the secondary electrode 130b, the tertiary electrode 130c, the quaternary electrode 130d, the primary common electrode 140, and the secondary common electrode 150) may independently have a thickness of approximately 1 nm to approximately 1000 nm, with an example thickness of approximately 10 nm to approximately 50 nm. Some of the electrodes (e.g., the primary electrode 130a, the secondary electrode 130b, the tertiary electrode 130c, the quaternary electrode 130d, or the at least one additional electrode, not shown) may be designed to allow healing of electrical breakdown (e.g., the electric breakdown of elastomeric polymer materials) of the first electroactive polymer element 105, the second electroactive polymer element 110, the third electroactive polymer element 115 and/or the at least one additional electroactive polymer element (not shown). In some embodiments, a thickness of an electrode (e.g., the primary electrode 130a, the secondary electrode 130b, the tertiary electrode 130c, the quaternary electrode 130d, or the at least one additional electrode, not shown) that may include a self-healing electrode (e.g., an aluminum electrode) may be approximately 20 nm.

In some embodiments, the electrodes (e.g., the primary electrode 130a, the secondary electrode 130b, the tertiary electrode 130c, the quaternary electrode 130d, the primary common electrode 140, and the secondary common electrode 150) may be fabricated using any suitable process. For example, the electrodes may be fabricated using physical vapor deposition (PVD), chemical vapor deposition (CVD), evaporation, spray-coating, spin-coating, atomic layer deposition (ALD), and the like. In another embodiment, the electrodes may be manufactured using a thermal evaporator, a sputtering system, a spray coater, a spin-coater, an ALD unit, and the like.

According to some embodiments, and referring to FIGS. 4A and 4B, an electroactive device 450 may include a pair of electrodes including a primary electrode 452 and a secondary electrode 454. These paired electrodes may be spaced with an electroactive polymer element 456 formed of a composite polymer positioned therebetween such that primary electrode 452 abuts a first surface 458 of electroactive polymer element 456 and secondary electrode 454 abuts a second surface 460 of electroactive polymer element 456 opposite the first surface 458. Electroactive polymer element 456 have any suitable dimensions, including any suitable thickness and/or width, without limitation.

In some embodiments, electroactive polymer element 456 may be deformable from an undeformed state, as illustrated in FIG. 4A, or a partially deformed state to a more fully deformed state, as illustrated in FIG. 4B, when a voltage difference is applied between primary electrode 452 and secondary electrode 454 and/or when the electroactive polymer element 456 is heated or cooled. In some embodiments, the deformed state of electroactive polymer element 456 may be a compressed state in which electroactive polymer element 456 has a decreased thickness $T_2$ in the z-direction, as shown in FIG. 4B.

Thickness, as used herein, may refer to the extent of at least a portion of an electroactive polymer element parallel to an E-field generated between paired electrodes abutting the electroactive polymer element. In some embodiments, the initial state of electroactive polymer element 456 may be a state that is not influenced by an E-field or one already influenced by an E-field generated between primary electrode 452 and secondary electrode 454, and the E-field may be increased to amplify the E-field-induced deformations. In FIG. 4A and FIG. 4B, the inclusions have been omitted for clarity.

An exemplary direction $E_1$ of the lines of the electrostatic field between primary electrode 452 and secondary electrode 454 is represented in FIGS. 4A and 4B. According to some embodiments, an amount of deformation of electroactive polymer element 456 in the deformed state, as shown in FIGS. 4A and 4B, may correspond to the strength of the E-field or, equivalently, an amount of voltage applied between primary electrode 452 and secondary electrode 454. In some embodiments, an amount of deformation of the electroactive polymer element 456 in the deformed state may correspond to the extent of heating or cooling of the electroactive polymer element 456, e.g., with respect to a transition temperature of the thermally deformation material disposed therein. A "transition temperature" as used herein may refer to a phase transition temperature, such as a vaporization temperature or a combustion temperature.

In at least one example, when electroactive polymer element 456 is in a compressed state, electroactive polymer element 456 may expand laterally (i.e., in the x-direction shown in FIG. 4B) such that electroactive polymer element 456 has an increased width in the x-direction. In some embodiments, in addition to, or in lieu of, an expansion in the x-direction, the electroactive polymer element 456 may expand laterally in the y-direction (not shown).

Electroactive polymer element 456 may have a maximum thickness (e.g., thickness $T_1$ shown in FIG. 4A) in an undeformed or relaxed state and a minimum thickness (e.g., thickness $T_2$ shown in FIG. 4B) in a deformed state (e.g., a maximally deformed state) when a voltage difference of at least a certain value is applied between primary electrode 452 and secondary electrode 454, when the electroactive polymer element 456 is exposed to radiation and/or when a temperature or pressure change of at least a certain amount is applied to the electroactive polymer element 456. In some embodiments the maximum thickness of electroactive polymer element 456 may be from approximately 10 nm to approximately 10 µm. Additionally, or alternatively, a width of electroactive polymer element 456 in the undeformed state may be from approximately 100 nm to approximately 100 µm (e.g., approximately 100 nm, approximately 500 nm, approximately 1 µm, approximately 10 µm, approximately 20 µm, approximately 30 µm, approximately 40 µm, approximately 50 µm, approximately 60 µm, approximately 70 µm, approximately 80 µm, approximately 90 µm, or approximately 100 µm, including ranges between any of the foregoing values). Width, as used herein, may refer to the extent of at least a portion of an electroactive polymer element in a dimension transverse to that of the expected electrostatic field.

An example electroactive device 500 configured to operate as a hybrid DEA/soft actuator is illustrated in FIGS. 5A-5D. The unactuated electroactive device 500 in FIG. 5A may include a composite electroactive polymer element 502 disposed between a primary electrode 505 and a secondary electrode 510. Inclusions 520 of a thermally expandable medium are disposed within a polymer matrix 515 of the electroactive polymer element 502.

According to some embodiments, the electroactive device 500 can be operated either as a dielectric elastomer actuator or as a soft actuator. In some embodiments, the electroactive device 500 can be operated as both a dielectric elastomer actuator and as a soft actuator. In certain embodiments, the deformed state of electroactive polymer element 502 may be a compressed state associated with the application of a voltage between the primary electrode 505 and the secondary electrode 510 as shown in FIG. 5B, or an expanded state associated with an increase in temperature (T), i.e., heating to a temperature greater than a transition temperature of the thermally expandable medium, which may cause a volume expansion of the inclusions 120 producing expanded inclusions 125 and an attendant expansion of the electroactive polymer element 502, as shown in FIG. 5C. By way of example, expanded inclusions 125 may include the vaporization product(s) resulting from vaporization of a liquid thermally expandable medium. Illustrated in FIG. 5D is an example actuated device following the application of a voltage between the primary electrode 505 and the secondary electrode 510 and an increase in temperature (T). As noted, the application of a voltage and the increase or decrease in temperature may be performed simultaneously or in succession.

In some embodiments, the operation of an electroactive device both as a DEA and as a soft actuator can be used to achieve the rapid actuation frequencies and efficiencies typically associated with DEAs, as well as the higher actuation amplitudes and actuation stresses typically associated with soft actuators, such as liquid-vapor soft actuators.

Figure 6A:
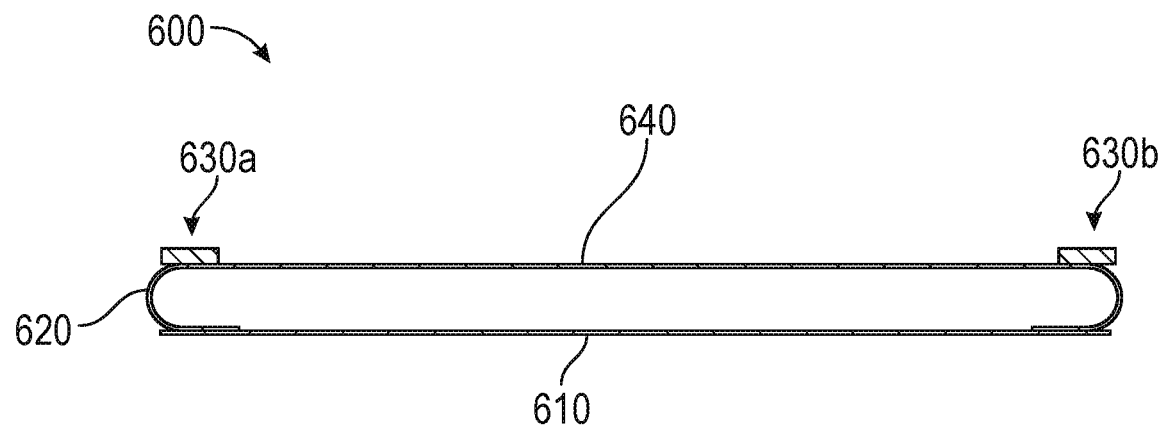
FIG. 6A shows a cross-sectional view of an example deformable element and a lens assembly that may include electroactive devices, in accordance with some embodiments of the disclosure.

By way of example, FIG. 6A shows a diagram of a cross-sectional view of a deformable element and a lens assembly that may include one or more electroactive devices, in accordance with example embodiments of the disclosure. As shown in FIG. 6A, adjustable lens 600 may be an adjustable lens with a structural support element 610 (e.g., a rigid backplane) and a deformable optical element 640, with a seal 620 formed between the structural support element 610 and the deformable optical element 640.

In various embodiments, the adjustable lens may include any suitable type of lens with adjustable optical properties (e.g., adjustable optical power/focal length, correcting for wavefront distortion and/or aberrations, etc.). In some examples, as will be explained in greater detail below, an adjustable lens may include a liquid lens. For example, adjustable lens 600 may be filled with an optical medium that is at least partially encapsulated by a deformable optical element (i.e., between structural support element 610 and deformable optical element 640). For example, lens 600 may be filled with a liquid or a semi-solid material (e.g., a gel, a semi-solid polymer, etc.). In general, lens 600 may contain a substantially transparent material that deforms and/or flows under pressure.

Structural support element 610 and deformable optical element 640 may be composed of any suitable materials. In some examples, structural support element 610 may include a rigid material. For example, structural support element 610 may be composed of a rigid, substantially transparent polymer. Deformable optical element 640 may include a substantially transparent and elastic material. For example, deformable optical element 640 may be composed of a natural or synthetic elastomer that returns to a resting state when a deforming force is removed. As will be explained in greater detail below, in some examples deformable optical element 640 may be deformed using an electroactive device generating a directly-driven force to produce a desired optical power or other optical property for lens 600.

Although the lens 600 is unactuated in FIG. 6A, forces may be applied by electroactive device(s) to lens 600 to actuate the lens 600 (as will be described in connection with FIG. 6B). Further, such forces may be uniform around a perimeter of lens 600 or may be variable around the perimeter of lens 600. For example, a vector (not shown) corresponding to a force applied by mechanical action of a first electroactive device (e.g., a first actuator) 630a may be the same as a vector corresponding to a force applied by mechanical action of a second electroactive device (e.g., a second actuator) 630b. Alternatively, a vector corresponding to a force applied by mechanical action of a first electroactive device 630a may be different from a vector corresponding to a force applied by mechanical action of a second electroactive device 630b.

Figure 6B:
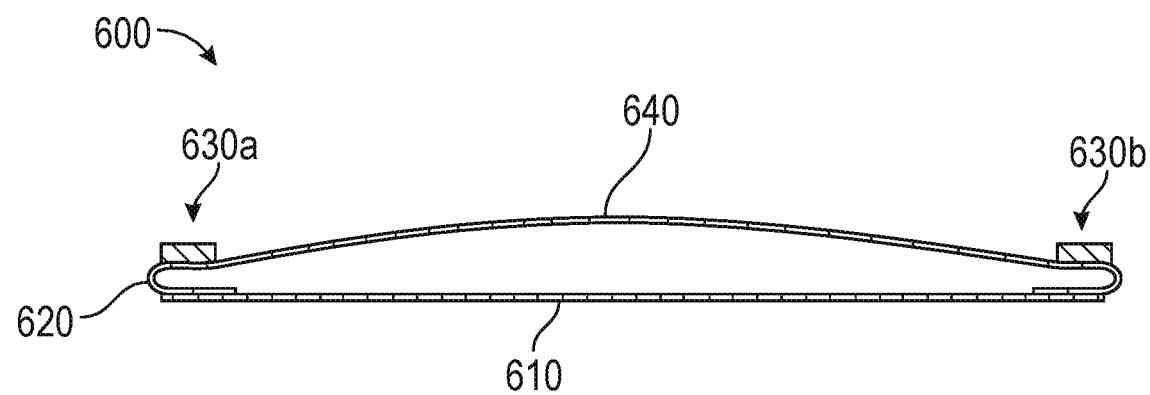
FIG. 6B shows another cross-sectional view of the deformable element and a lens assembly of FIG. 6A in an actuated state, in accordance with some embodiments of the disclosure.

FIG. 6B shows a diagram of a cross-sectional view of the example deformable element and a lens assembly of FIG. 6A in an actuated state, in accordance with example embodiments of the disclosure. In particular, FIG. 6B depicts adjustable lens 600 being actuated by receiving force applied by mechanical action of two different electroactive devices. In this example, a first electroactive device (e.g., a first actuator) 630a may apply a pushing force (not shown) having a vector of a first magnitude and first direction to a first area on the perimeter of lens 600. A second electroactive device (e.g., a second actuator) 630b may apply a pushing force (not shown) having vector of a second magnitude and second direction to a second area on the perimeter of lens 600 to achieve a desired optical power or other optical property for the lens 600. Those skilled in the art will understand that other embodiments may use various combinations of compression and distension, with various numbers of actuators applying varying forces to various locations on a deformable optical element to achieve desired optical properties for the lens.

The forces applied by the electroactive device in FIG. 6A to actuate the lens 600, as well as any other suitable forces, may be applied by any suitable type electroactive device, such as that shown and described in connection with FIG. 1 of the disclosure.

In another embodiment, at least one of the electroactive devices (e.g., one of the electroactive devices 630a and 630b) may include a direct-drive actuator. As used in some embodiments, the term "direct-drive actuator" may refer to any actuator used in a direct-drive system or configuration (e.g., any configuration that does not involve an intermediate, off-axis device to transmit power). In contrast, indirect-drive systems may have at least one drive-train component (e.g., a belt, a chain, a ball-screw mechanism, a gear, etc.) that is not connected along the same axis of movement as the actuator. Examples of direct-drive actuators may include, without limitation, electrically driven actuators, electroactive benders, voice coil actuators, shape memory alloys, hydraulic pumps, etc.

As noted, in various embodiments, a direct-drive actuator may include a bender. In some examples, the term "bender," as used herein, may refer, without limitation, to an electrically-driven actuator based on a plate or beam design that converts in-plane contraction, via an applied electric field, into out-of-plane displacement. A bender or bending actuator may include an all-electroactive or composite material stack operated in a bimorph, unimorph, or multilayered monolith configuration. In some embodiments, the term "unimorph bender," as used herein, may refer, without limitation, to a beam or plate having an electroactive layer and an inactive layer, in which displacement results from contraction or expansion of the electroactive layer. In some embodiments, the term "bimorph bender," as used herein, may refer, without limitation, to a beam or plate having two electroactive layers, in which displacement results from expansion or contraction of one layer with alternate contraction or expansion of the second layer.

In some embodiments, the term "multilayer bender," as used herein, may refer, without limitation, to a multilayer stack of electroactive, electrode, and insulation layers integrated with alternating contracting and expanding electroactive layers into a monolithic bender. The piezoelectric layers in multilayer piezoelectric benders may enable high electric fields (and therefore high force and displacement) to occur at low voltages. Multilayer benders may include multiple thin piezoceramic layers, which may require lower voltages to achieve similar internal stress to bimorph and unimorph designs. Charge and voltage control in open or closed loops may also be implemented in multilayer benders, with some adjustment. In some examples, a control system for a multilayer bender may not require a high voltage power supply.

According to some embodiments, an actuator may be a frame-contoured ring bender and/or may include stacked or overlapping benders. Furthermore, actuator volume may be constrained to an edge region outside an optical aperture, which may include a perimeter volume of a lens, an optical element, an optical sub-assembly, etc. As noted, electroactive device(s) such as an actuator (or a set of actuators) may provide equal or varied force and displacement at discrete points or along a spatially-defined distribution at the perimeter of a lens.

The electroactive device including direct-drive benders disclosed herein may include an electroactive polymer element that is disposed between two electrodes. In such examples, methods of forming an electroactive device may involve forming electrodes and an electroactive polymer simultaneously (e.g., via co-flowing, slot die coating, etc.).

FIG. 7 shows a diagram of an example cross-sectional view of a lens assembly device with multiple deformable elements (e.g., multiple liquid lenses) including electroactive devices, in accordance with example embodiments of the disclosure. In particular, FIG. 7 shows a side view of a lens-display assembly 700. As shown in FIG. 7, lens-display assembly 700 may include an adjustable-focus lens 760a and an adjustable-focus lens 760b. In addition, lens-display assembly 700 may include a carriage 730a and a carriage 730b, each of which connect adjustable-focus lens 760a to adjustable-focus lens 760b (e.g., via respective electroactive devices).

Because carriages 730a and 730b are connected to electroactive devices (e.g., direct-drive actuators) coupled to both adjustable-focus lens 760a and adjustable-focus lens 760b, when carriage 730a and/or 730b moves, carriage 730a and/or 730b may apply forces to adjustable-focus lens 760a and adjustable focus lens 760b simultaneously, thereby deforming and modifying the optical power of adjustable-focus lenses 760a and 760b.

In addition, in some examples, lens-display assembly 700 may include a display 745 situated between adjustable-focus lenses 760a and 760b. For example, display 745 may include an augmented-reality display that is substantially translucent (except for, e.g., virtual objects displayed by display 745), allowing a user's eye 750 to see beyond display 745 to real-world objects such as a tree 755 illustrated in FIG. 7.

In some embodiments, carriages 730a and 730b may each apply equal pressure to adjustable-focus lens 760a and adjustable focus lens 760b (e.g., pressure sufficient to maintain tension within the respective membranes of adjustable-focus lenses 760a and 760b but not to deform adjustable-focus lenses 760a and 760b). Accordingly, adjustable-focus lenses 760a and 760b may be flat and exhibit no substantial optical power. Thus, the apparent accommodation distance of a virtual object displayed by display 745 may be the actual distance of display 745 from the user's eye 750. Likewise, lens-display assembly 700 may not significantly change the appearance of tree 755 to the user's eye 750.

In some examples, one or more of the carriages described herein may be rigid. Additionally or alternatively, one or more of the carriages described herein may have a degree of elasticity in one or more directions. In some examples, the length of the carriages may be fixed. In some examples, the length of the carriages may be adjustable. For example, the length of a carriage may be manually adjustable by using, e.g., a set screw or an adjustable threaded shaft. Additionally or alternatively, the length of the carriage may be dynamically adjustable through the use of, e.g., a piezoelectric stack.

FIG. 7 depicts lens-display assembly 700 in an adjusted state. As shown in FIG. 7, carriages 730a and 730b may be actuated by one or more actuators (e.g., electroactive devices as described herein) to move away from the user's eye 750 and adjustable-focus lens 760a, and toward adjustable-focus lens 760b. In the process, forces 740a and 740b applied by carriages 730a and 730b, respectively, may shape adjustable-focus lens 760a into a plano-concave lens, and shape adjustable-focus lens 760b into a plano-convex lens. Adjustable-focus lens 760a may thereby cause an image displayed by display 745 to appear closer to eye 750. At the same time, adjustable-focus lens 760b may compensate for the optical power created by adjustable-focus lens 760a so that the appearance of tree 755 is not significantly affected by the change to adjustable-focus lens 760a.

As should be appreciated, in some examples intermediate positions of carriages 730a and 730b may result in intermediate changes to the apparent accommodation distance of images displayed by display 745, allowing for a continuous range of possible apparent accommodation distances for virtual objects while maintaining the fidelity of the appearance of real-world objects.

In some embodiments, additional optical elements such as lens 765a and lens 765b may be included to provide additional optical power. In some embodiments, the lenses 765a and 765b may include prescription lenses that may be used to treat refractive errors of the eye, which may include, for example, myopia, hypermetropia, astigmatism, and presbyopia, and the like. In other embodiments, the prescription lenses may be customized to correct for a given user's refractive errors, which may include various components, such as a sphere component to address myopia and/or presbyopia, a cylinder component to address astigmatism, and a prism component to address strabismus and other binocular vision disorders.

FIG. 8 illustrates a cross-section of a lens-display assembly 800, in accordance with at least one embodiment. As shown in FIG. 8, lens-display assembly 800 may include an adjustable lens 805, an adjustable lens 810, a display 845 positioned between adjustable lenses 805 and 810, and a lens assembly housing 825. In some examples, the volume between lens assembly housing 825 and display 845 may provide space for electroactive devices (e.g., direct drive actuators) as described herein. According to some examples, the combination of adjustable lenses 805 and 810 may modify the apparent accommodation distance of images created by display 845 without changing the appearance of distant real-world objects (e.g., tree 855) as perceived by a user's eye 950.

As shown in FIG. 9, a near-eye display system 900 may include a near-eye display (NED) 910 and a control system 920, which may be communicatively coupled to each other. The near-eye display 910 may include lenses 912, electroactive devices (e.g., actuators) 914, displays 916, and a sensor 918. Control system 920 may include a control element 922, a force lookup table (LUT) 924, and augmented reality (AR) logic 926.

Augmented reality logic 926 may determine what virtual objects are to be displayed and real-world positions onto which the virtual objects are to be projected. Accordingly, augmented reality logic 926 may generate an image stream 928 that is displayed by displays 916 in such a way that alignment of right- and left-side images displayed in displays 916 results in ocular vergence toward a desired real-world position.

Control element 922 may use the same positioning information determined by augmented reality logic 926, in combination with force lookup table 924, to determine an amount of force to be applied by electroactive devices 914 (e.g., actuators), as described herein, to lenses 912. Electroactive devices 914 may, responsive to control element 922, apply appropriate forces to lenses 912 to adjust the apparent accommodation distance of virtual images displayed in displays 916 to match the apparent vergence distance of the virtual images, thereby reducing or eliminating vergence-accommodation conflict. Control element 922 may be in communication with sensor 918, which may measure a state of the adjustable lens. Based on data received from sensor 918, the control element 922 may adjust electroactive devices 914 (e.g., as a closed-loop control system).

In some examples, display system 900 may display multiple virtual objects at once and may determine which virtual object a user is viewing (or is likely to be viewing) to identify a virtual object for which to correct the apparent accommodation distance. For example, the system may include an eye tracking system (not shown) that provides information to control element 922 to enable control element 922 to select the position of the relevant virtual object.

Additionally or alternatively, augmented reality logic 926 may provide information about which virtual object is the most important and/or most likely to draw the attention of the user (e.g., based on spatial or temporal proximity, movement, and/or a semantic importance metric attached to the virtual object). In some examples, the augmented reality logic 926 may identify multiple potentially important virtual objects and select an apparent accommodation distance that approximates the virtual distance of a group of the potentially important virtual objects.

Control system 920 may represent any suitable hardware, software, or combination thereof for managing adjustments to adjustable lenses 912. In some examples, control system 920 may represent a system on a chip (SOC). As such, one or more portions of control system 920 may include one or more hardware modules. Additionally or alternatively, one or more portions of control system 920 may include one or more software modules that perform one or more of the tasks described herein when stored in the memory of a computing device and executed by a hardware processor of the computing device.

Control system 920 may generally represent any suitable system for providing display data, augmented reality data, and/or augmented reality logic for a head-mounted display. In some examples, control system 920 may include a graphics processing unit (GPU) and/or any other type of hardware accelerator designed to optimize graphics processing.

Control system 920 may be implemented in various types of systems, such as the augmented reality glasses 1000 illustrated in FIG. 10. As shown, glasses 1000 may include adjustable-focus lenses 1010 coupled to a frame 1030 (e.g., at an eyewire, not shown). In some embodiments, control system 920 of FIG. 9 may be integrated into frame 1030. Alternatively, all or a portion of control system 920 may be in a system remote from glasses 1000 and configured to control electroactive devices (e.g., actuators) in glasses 1000 via wired or wireless communication.

In an embodiment, each of lenses 1010 may include, for example, an optical fluid encapsulated by an elastomeric membrane and an optically clear and rigid back substrate. Actuation along the perimeter of lenses 1010 (e.g., using one or more electroactive devices as further shown and described in connection with FIG. 1) may change the curvature (and thus the optical power) of the lenses, with positive and negative shapes determined by the direction of the applied force. In an embodiment, a membrane surface may be non-planar (e.g., concave or convex) at rest (e.g., at zero electrical power). In one example, a membrane surface may be non-planar when a substrate is curved.

Electroactive devices (e.g., actuators) mounted in frame 1030 (e.g., in an eyewire) may deform each lens, with high optical quality achieved through tailored displacement and deflection, and via perimeter mounting for an asymmetric clear aperture including, for example, an RGB (red-green-blue) waveguide.

As noted, control system 920 of FIG. 9 may trigger electroactive devices to adjust lenses (e.g., lenses 1010) to help address the vergence-accommodation conflict. The vergence-accommodation conflict may result from how humans perceive depth. When a human eye fixates on an object, it accommodates to that object—that is, it changes focal distance to bring that object into focus. That accommodation is a visual cue to depth: objects that are much closer or further away than that distance are out of focus on the retina. This "retinal blur" is a cue that objects are at a different distance than the accommodative distance, although the cue is ambiguous as to whether the objects are closer or more distant.

When both eyes are used (stereoscopically), binocular disparity is the main visual cue for depth. The two eyes look at an object from slightly different angles, so they get slightly different views of the object. This difference in views is the binocular disparity (imperfect match) between the two views. The visual system normally fuses these two images into a single perception and converts the disparity between the two images into a perception of depth. The closer an object is, the larger the disparity (error in matching) between the images it produces on the two retinas.

In a typical virtual reality head-mounted device, a virtual display plane, or focal plane, may be located at a fixed distance. But virtual objects may be "located" either in front of or behind the focal plane. The head-mounted display may try to reproduce binocular disparity for such virtual objects, which is the main visual cue for depth. But the binocular disparity cue may drive the eyes to verge at one distance, while the light rays coming from the virtual plane may produce retinal blur that drives the eyes to accommodate to another distance, creating a conflict between those depth cues and forcing the viewer's brain to unnaturally adapt to conflicting cues. This vergence-accommodation conflict in turn creates visual fatigue, especially during prolonged use of an augmented reality system.

Figure 11:
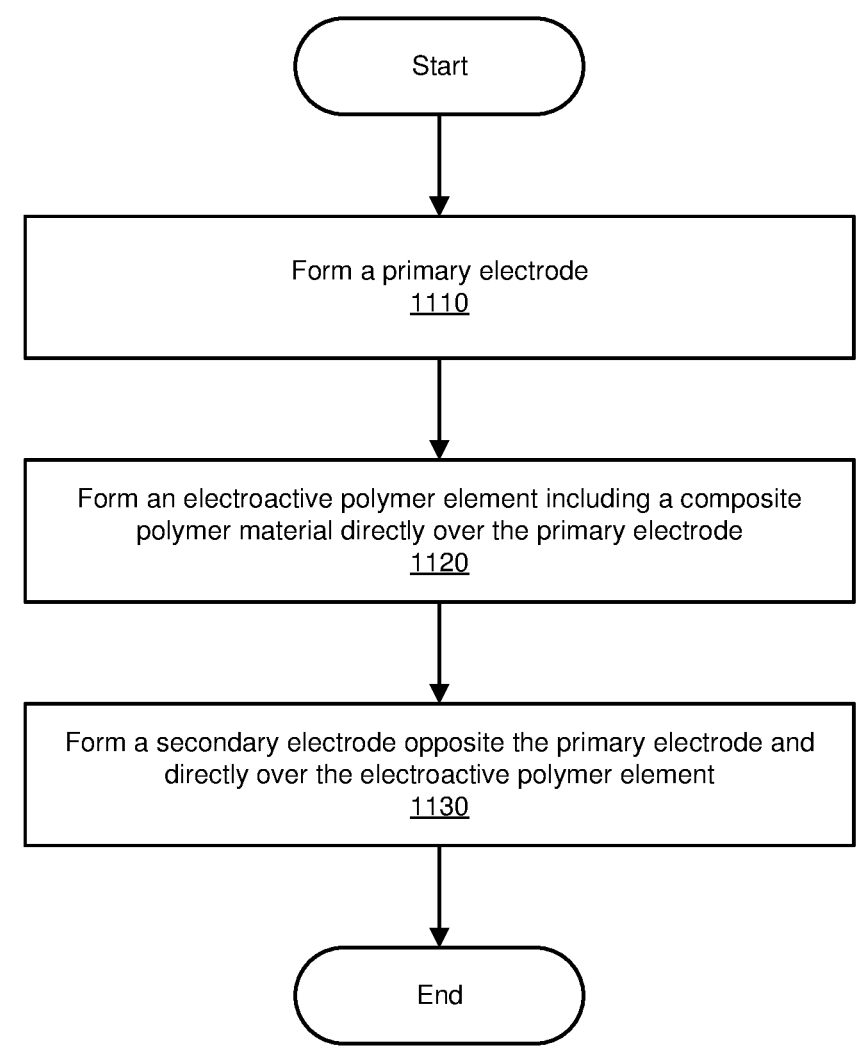
FIG. 11 is a flow diagram of an example method for fabricating electroactive devices according to some embodiments.

FIG. 11 shows a flow diagram of an example method 1100 for producing an electroactive device, in accordance with example embodiments of the disclosure. At step 1110, a primary electrode (e.g., primary electrode 130a in FIG. 1) may be formed.

At step 1120 in FIG. 11, an electroactive polymer element (e.g., first electroactive polymer element 105 in FIG. 1) including a composite polymer material may be formed directly over the primary electrode.

At step 1130 in FIG. 11, a secondary electrode (e.g., secondary electrode 130b in FIG. 1) may be formed opposite the primary electrode and directly over the electroactive polymer element. The composite polymer material may include a polymer matrix with inclusions of a deformable medium dispersed throughout the polymer matrix.

According to various embodiments, the electroactive polymer element of an electroactive device is disposed between electrodes and may include a composite polymer material. The composite polymer material may include a polymer matrix and inclusions containing a deformable medium disposed within the polymer matrix. The inclusions may be distributed regularly or randomly throughout the polymer matrix and enable engineering of various characteristics of the electroactive polymer element, such as the stress-strain behavior of the electroactive polymer element in the presence of a voltage gradient between the electrodes, radiation exposure and/or a temperature or pressure change.

In some embodiments, an electroactive polymer element may include multiple layers (e.g., hundreds or thousands of sub-micron layers) of a composite polymer material disposed between multiple corresponding electrode pairs. As described in connection with various embodiments, a dimension of the electroactive polymer element(s) can be changed (increased or decreased) by applying a voltage between the primary electrode and the secondary electrode, exposing the deformable medium to a source of radiation and/or by changing a temperature or a pressure of the deformable medium. Operation of such a device as both a DEA and a soft actuator can be used to achieve rapid actuation frequencies and efficiencies, as well as higher actuation amplitudes and actuation stresses.

Electroactive devices described and shown herein may be utilized in any suitable technologies, without limitation. For example, such electroactive devices may be utilized as mechanical actuators to actuate movement of adjacent components. In at least one embodiment, the disclosed electroactive devices may be incorporated into optical systems such as adjustable lenses (e.g., fluid-filled lenses) as described herein to actuate movement of one or more optical layers. Such actuation may, for example, allow for selected movement of lens layers of an adjustable lens, resulting in deformation of the lens layers to adjust optical characteristics (e.g., focal point, spherical correction, cylindrical correction, axial correction, etc.) of the adjustable lens. In some embodiments, electroactive devices as disclosed herein may be utilized as actuators in micromechanical apparatuses, such as microelectromechanical devices. Additionally or alternatively, electroactive devices may be used for converting mechanical energy to electrical energy for use in energy harvesting systems and/or sensor apparatuses.

Embodiments of the instant disclosure may include or be implemented in conjunction with an artificial reality system. Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., perform activities in) an artificial reality. The artificial reality system that provides the artificial reality content may be implemented on various platforms, including a head-mounted display (HMD) connected to a host computer system, a standalone HMD, a mobile device or computing system, or any other hardware platform capable of providing artificial reality content to one or more viewers.

The display devices and systems described and/or illustrated herein broadly represent any type or form of computing device or system capable of executing computer-readable instructions, such as those contained within the modules described herein. In their most basic configuration, these device(s) may each include at least one memory device and at least one physical processor.

In some examples, the term "memory device" generally refers to any type or form of volatile or non-volatile storage device or medium capable of storing data and/or computer-readable instructions. In one example, a memory device may store, load, and/or maintain one or more of the modules described herein. Examples of memory devices include, without limitation, Random Access Memory (RAM), Read Only Memory (ROM), flash memory, Hard Disk Drives (HDDs), Solid-State Drives (SSDs), optical disk drives, caches, variations or combinations of one or more of the same, or any other suitable storage memory.

In some examples, the term "physical processor" generally refers to any type or form of hardware-implemented processing unit capable of interpreting and/or executing computer-readable instructions. In one example, a physical processor may access and/or modify one or more modules stored in the above-described memory device. Examples of physical processors include, without limitation, microprocessors, microcontrollers, Central Processing Units (CPUs), Field-Programmable Gate Arrays (FPGAs) that implement softcore processors, Application-Specific Integrated Circuits (ASICs), portions of one or more of the same, variations or combinations of one or more of the same, or any other suitable physical processor.

In some embodiments, the term "computer-readable medium" generally refers to any form of device, carrier, or medium capable of storing or carrying computer-readable instructions. Examples of computer-readable media include, without limitation, transmission-type media, such as carrier waves, and non-transitory-type media, such as magnetic-storage media (e.g., hard disk drives, tape drives, and floppy disks), optical-storage media (e.g., Compact Disks (CDs), Digital Video Disks (DVDs), and BLU-RAY disks), electronic-storage media (e.g., solid-state drives and flash media), and other distribution systems.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the instant disclosure. The embodiments disclosed herein should be considered in all respects illustrative and not restrictive. Reference should be made to the appended claims and their equivalents in determining the scope of the instant disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. A device comprising:
   a primary electrode;
   a secondary electrode overlapping at least a portion of the primary electrode; and
   an electroactive polymer element comprising a composite polymer material disposed between and abutting the primary electrode and the secondary electrode, wherein the composite polymer material comprises a polymer matrix and inclusions of a phase-changeable material that undergoes a change in volume when the phase-changeable material changes phase, the phase-changeable material comprising at least one of a liquid, a gas, or a liquid-gas mixture disposed throughout the polymer matrix.

2. The device of claim 1, wherein the electroactive polymer element has a thickness of approximately 100 nanometers to approximately 10 micrometers.

3. The device of claim 1, wherein the electroactive polymer element further comprises particles of a material having a high dielectric constant, the particles having an average diameter between approximately 10 nm and approximately 1000 nm.

4. The device of claim 3, wherein the high dielectric constant particles comprise barium titanate.

5. The device of claim 1, wherein the composite polymer material comprises mutually isolated inclusions.

6. The device of claim 1, wherein the composite polymer material comprises interconnected inclusions.

7. The device of claim 1, wherein the liquid comprises at least one of an alcohol, glycol, water, paraffin, trimethylolethane, lauric acid, a solution of a carbonate compound, or a solution of a peroxide compound.

8. The device of claim 1, wherein the gas comprises at least one of nitrogen, oxygen, argon, or sulfur hexafluoride.

9. The device of claim 1, wherein the electroactive polymer element is characterized by three or more of:
   (i) an actuation frequency of at least 1 MHz;
   (ii) an actuation efficiency of at least 20%;
   (iii) an actuation amplitude of at least 100%; and
   (iv) an actuation stress of at least 1 MPa.

10. An electroactive device comprising:
    a primary electrode;
    a secondary electrode overlapping at least a portion of the primary electrode; and
    an electroactive polymer element comprising a composite polymer material disposed between and abutting the primary electrode and the secondary electrode, wherein the composite polymer material comprises a polymer matrix and inclusions of a deformable medium comprising a phase-changeable material that undergoes a change in volume when the phase-changeable material changes phase, the inclusions of the deformable medium being dispersed throughout the polymer matrix.

11. The electroactive device of claim 10, wherein the electroactive polymer element further comprises particles of a material having a high dielectric constant, the particles having an average diameter between approximately 10 nm and approximately 1000 nm.

12. The electroactive device of claim 11, wherein the high dielectric constant particles comprise barium titanate.

13. The electroactive device of claim 10, wherein the composite polymer material comprises mutually isolated inclusions.

14. The electroactive device of claim 10, wherein the deformable medium comprises a high dielectric strength fluid.

15. The electroactive device of claim 10, wherein the deformable medium comprises at least one of an alcohol, glycol, water, paraffin, trimethylolethane, lauric acid, a solution of a carbonate compound, or a solution of a peroxide compound.

16. The electroactive device of claim 10, wherein the deformable medium is adapted to undergo a reversible phase transformation.

17. The electroactive device of claim 10, wherein the electroactive polymer element is characterized by three or more of:
   (i) an actuation frequency of at least 1 MHz;
   (ii) an actuation efficiency of at least 20%;
   (iii) an actuation amplitude of at least 100%; and
   (iv) an actuation stress of at least 1 MPa.

18. The electroactive device of claim 10, wherein a dimension of the electroactive polymer element is changeable by at least one of:
   (i) applying a voltage between the primary electrode and the secondary electrode;
   (ii) exposing the deformable medium to a source of radiation;
   (iii) changing a temperature of the deformable medium; or
   (iv) changing a pressure of the deformable medium.

19. A method comprising:
   forming a primary electrode;
   forming an electroactive polymer element comprising a composite polymer material directly over the primary electrode; and
   forming a secondary electrode opposite the primary electrode and directly over the electroactive polymer element, wherein the composite polymer material comprises a polymer matrix and inclusions of a deformable medium comprising a phase-changeable material that undergoes a change in volume when the phase-changeable material changes phase, the inclusions of the deformable medium being dispersed throughout the polymer matrix.

20. The method of claim 19, further comprising changing a dimension of the electroactive polymer element by at least one of:
   (i) applying a voltage between the primary electrode and the secondary electrode;
   (ii) exposing the deformable medium to a source of radiation;
   (iii) changing a temperature of the deformable medium; or
   (iv) changing a pressure of the deformable medium.

* * * * *

UNITED STATES PATENT AND TRADEMARK OFFICE
CERTIFICATE OF CORRECTION

PATENT NO. : 11,114,952 B1  Page 1 of 1
APPLICATION NO. : 16/197397
DATED : September 7, 2021
INVENTOR(S) : Wallin et al.

It is certified that error appears in the above-identified patent and that said Letters Patent is hereby corrected as shown below:

On the Title Page

Item (72), Inventors, Line 9, delete "Mengue," and insert -- Menguc, --, therefor.

Signed and Sealed this
Fourteenth Day of December, 2021

Drew Hirshfeld
*Performing the Functions and Duties of the*
*Under Secretary of Commerce for Intellectual Property and*
*Director of the United States Patent and Trademark Office*